(12) United States Patent
Chen et al.

(10) Patent No.: US 11,961,805 B2
(45) Date of Patent: Apr. 16, 2024

(54) DEVICES AND METHODS RELATED TO DUAL-SIDED RADIO-FREQUENCY PACKAGE WITH OVERMOLD STRUCTURE

(71) Applicant: SKYWORKS SOLUTIONS, INC., Irvine, CA (US)

(72) Inventors: Howard E. Chen, Anaheim, CA (US); Robert Francis Darveaux, Corona Del Mar, CA (US)

(73) Assignee: Skyworks Solutions, Inc., Irvine, CA (US)

(*) Notice: Subject to any disclaimer, the term of this patent is extended or adjusted under 35 U.S.C. 154(b) by 198 days.

(21) Appl. No.: 17/473,207

(22) Filed: Sep. 13, 2021

(65) Prior Publication Data

US 2022/0115331 A1 Apr. 14, 2022

Related U.S. Application Data

(63) Continuation of application No. 16/833,625, filed on Mar. 29, 2020, now Pat. No. 11,127,690, which is a
(Continued)

(51) Int. Cl.
*H01L 23/49* (2006.01)
*H01L 21/285* (2006.01)
(Continued)

(52) U.S. Cl.
CPC ........ *H01L 23/552* (2013.01); *H01L 21/2855* (2013.01); *H01L 21/32051* (2013.01);
(Continued)

(58) Field of Classification Search
CPC ............ H01L 23/552; H01L 23/49816; H01L 23/49827; H01L 23/49838; H01L 21/2855;
(Continued)

(56) References Cited

U.S. PATENT DOCUMENTS 6,194,250 B1 2/2001 Melton et al.
6,415,977 B1 7/2002 Rumsey
(Continued)

FOREIGN PATENT DOCUMENTS

CN 103582946 2/2014
CN 104319239 1/2015
(Continued)

OTHER PUBLICATIONS

International Search Report dated Feb. 21, 2018 for PCT/US2017/054953.
Written Opinion dated Feb. 21, 2018 for PCT/US2017/054953.

*Primary Examiner* — Phuc T Dang
(74) *Attorney, Agent, or Firm* — Chang & Hale LLP

(57) ABSTRACT

A packaged radio-frequency device is disclosed, including a packaging substrate configured to receive one or more components, the packaging substrate including a first side and a second side. A shielded package may be implemented on the first side of the packaging substrate, the shielded package including a first circuit and a first overmold structure, the shielded package configured to provide radio-frequency shielding for at least a portion of the first circuit. A set of through-mold connections may be implemented on the second side of the packaging substrate, the set of through-mold connections defining a mounting volume on the second side of the packaging substrate. The device may include a component implemented within the mounting volume and a second overmold structure substantially encapsulating one or more of the component or the set of through-mold connections.

18 Claims, 20 Drawing Sheets

Related U.S. Application Data continuation of application No. 15/724,722, filed on Oct. 4, 2017, now Pat. No. 10,607,944.

(60) Provisional application No. 62/404,015, filed on Oct. 4, 2016, provisional application No. 62/404,022, filed on Oct. 4, 2016, provisional application No. 62/404,029, filed on Oct. 4, 2016.

(51) Int. Cl.

| | | |
|---|---|---|
| *H01L 21/3205* | (2006.01) | |
| *H01L 21/48* | (2006.01) | |
| *H01L 21/56* | (2006.01) | |
| *H01L 21/683* | (2006.01) | |
| *H01L 21/768* | (2006.01) | |
| *H01L 21/78* | (2006.01) | |
| *H01L 23/00* | (2006.01) | |
| *H01L 23/498* | (2006.01) | |
| *H01L 23/552* | (2006.01) | |
| *H01L 23/66* | (2006.01) | |
| *H05K 1/18* | (2006.01) | |
| *H01L 23/31* | (2006.01) | |
| *H01L 23/48* | (2006.01) | |
| *H01L 25/00* | (2006.01) | |
| *H01L 25/03* | (2006.01) | |
| *H01L 25/10* | (2006.01) | |
| *H01L 25/16* | (2023.01) | |
| *H01L 25/18* | (2023.01) | |

(52) U.S. Cl.

CPC ........ *H01L 21/4853* (2013.01); *H01L 21/561* (2013.01); *H01L 21/563* (2013.01); *H01L 21/565* (2013.01); *H01L 21/6836* (2013.01); *H01L 21/76802* (2013.01); *H01L 21/76877* (2013.01); *H01L 21/78* (2013.01); *H01L 23/49816* (2013.01); *H01L 23/49827* (2013.01); *H01L 23/49838* (2013.01); *H01L 23/66* (2013.01); *H01L 24/49* (2013.01); *H01L 24/73* (2013.01); *H05K 1/181* (2013.01); *H01L 23/3107* (2013.01); *H01L 23/3128* (2013.01); *H01L 23/481* (2013.01); *H01L 23/49805* (2013.01); *H01L 23/49811* (2013.01); *H01L 24/16* (2013.01); *H01L 24/48* (2013.01); *H01L 24/81* (2013.01); *H01L 24/97* (2013.01); *H01L 25/03* (2013.01); *H01L 25/105* (2013.01); *H01L 25/16* (2013.01); *H01L 25/18* (2013.01); *H01L 25/50* (2013.01); *H01L 2221/68327* (2013.01); *H01L 2223/6611* (2013.01); *H01L 2223/6616* (2013.01); *H01L 2224/16141* (2013.01); *H01L 2224/16145* (2013.01); *H01L 2224/16225* (2013.01); *H01L 2224/16227* (2013.01); *H01L 2224/48091* (2013.01); *H01L 2224/48106* (2013.01); *H01L 2224/48225* (2013.01); *H01L 2224/48227* (2013.01); *H01L 2224/49052* (2013.01); *H01L 2224/73257* (2013.01); *H01L 2224/97* (2013.01); *H01L 2225/1058* (2013.01); *H01L 2225/107* (2013.01); *H01L 2924/00014* (2013.01); *H01L 2924/1421* (2013.01); *H01L 2924/15311* (2013.01); *H01L 2924/15321* (2013.01); *H01L 2924/19106* (2013.01); *H01L 2924/3025* (2013.01); *H05K 2201/10378* (2013.01); *H05K 2201/10734* (2013.01)

(58) Field of Classification Search

CPC ............. H01L 21/32051; H01L 21/561; H01L 21/563; H01L 21/76802; H01L 21/76877

USPC ........................................................ 257/659

See application file for complete search history.

(56) References Cited

U.S. PATENT DOCUMENTS

| | | |
|---|---|---|
| 6,803,324 B2 | 10/2004 | Ogawa |
| 6,889,902 B2 | 5/2005 | Rumsey |
| 7,127,365 B2 | 10/2006 | Rumsey |
| 7,255,273 B2 | 8/2007 | Rumsey |
| 7,345,361 B2 | 3/2008 | Malik et al. |
| 7,372,151 B1 | 5/2008 | Fan et al. |
| 7,642,133 B2 | 1/2010 | Wu et al. |
| 7,777,351 B1 | 8/2010 | Berry et al. |
| 8,067,306 B2 | 11/2011 | Yang et al. |
| 8,222,538 B1 | 7/2012 | Yoshida et al. |
| 8,299,595 B2 | 10/2012 | Yoon et al. |
| 8,354,340 B2 | 1/2013 | Kurita |
| 8,373,264 B2 | 2/2013 | Welch |
| 8,378,476 B2 | 2/2013 | Lee et al. |
| 8,508,045 B2 | 8/2013 | Khan et al. |
| 8,633,591 B2 | 1/2014 | Kurita |
| 8,704,368 B1 | 4/2014 | Yoshida et al. |
| 8,823,174 B2 | 9/2014 | Kurita |
| 8,975,750 B2 | 3/2015 | Kurita |
| 9,012,789 B1 | 4/2015 | Yoshida et al. |
| 9,299,648 B2 | 3/2016 | Shim et al. |
| 9,355,444 B2 | 5/2016 | Nava |
| 9,385,006 B2 | 7/2016 | Lin et al. |
| 9,406,602 B2 | 8/2016 | Kurita |
| 9,419,667 B2 | 8/2016 | LoBianco |
| 9,564,937 B2 | 2/2017 | LoBianco |
| 9,730,327 B1 | 8/2017 | Yoshida et al. |
| 9,788,466 B2 | 10/2017 | Chen |
| 9,837,303 B2 | 12/2017 | Lin et al. |
| 9,837,331 B1 | 12/2017 | Kim et al. |
| 9,842,798 B2 | 12/2017 | Marimuthu et al. |
| 9,922,955 B2 | 3/2018 | Camacho et al. |
| 9,941,221 B2 | 4/2018 | Chen et al. |
| 10,034,372 B1 | 7/2018 | Yoshida et al. |
| 10,192,816 B2 | 1/2019 | Kelly et al. |
| 10,206,285 B1 | 2/2019 | Yoshida et al. |
| 10,410,885 B2 | 9/2019 | Darveaux |
| 10,410,967 B1 | 9/2019 | Do et al. |
| 10,446,479 B2 | 10/2019 | Marimuthu et al. |
| 10,460,957 B2 | 10/2019 | Darveaux |
| 10,607,944 B2 | 3/2020 | Chen et al. |
| 2002/0016056 A1 | 2/2002 | Corisis |
| 2002/0148897 A1 | 10/2002 | Rumsey |
| 2003/0162386 A1 | 8/2003 | Ogawa |
| 2004/0026515 A1 | 2/2004 | Rumsey |
| 2004/0030517 A1 | 2/2004 | Rumsey |
| 2005/0121764 A1 | 6/2005 | Malik et al. |
| 2007/0216007 A1 | 9/2007 | Lee et al. |
| 2008/0042301 A1 | 2/2008 | Yang |
| 2008/0079163 A1 | 4/2008 | Kurita |
| 2009/0002967 A1 | 1/2009 | Asami |
| 2009/0194851 A1 | 8/2009 | Chiu et al. |
| 2009/0236700 A1 | 9/2009 | Moriya |
| 2010/0171205 A1 | 7/2010 | Chen et al. |
| 2010/0172116 A1 | 7/2010 | Yorita |
| 2010/0224974 A1 | 9/2010 | Shim et al. |
| 2010/0230789 A1 | 9/2010 | Yorita |
| 2010/0237482 A1 | 9/2010 | Yang et al. |
| 2010/0246152 A1 | 9/2010 | Lin et al. |
| 2011/0084378 A1 | 4/2011 | Welch |
| 2011/0210437 A1 | 9/2011 | Yang et al. |
| 2011/0227209 A1 | 9/2011 | Yoon et al. |
| 2011/0233747 A1 | 9/2011 | Lee et al. |
| 2012/0013001 A1 | 1/2012 | Haba |
| 2012/0074538 A1 | 3/2012 | Tsai et al. |
| 2012/0146181 A1 | 6/2012 | Lin et al. |
| 2012/0223429 A1 | 9/2012 | Khan et al. |
| 2012/0225522 A1 | 9/2012 | Zhao et al. |
| 2013/0099390 A1 | 4/2013 | Kurita |
| 2013/0119539 A1 | 5/2013 | Hsiao et al. |
| 2013/0168856 A1 | 7/2013 | Wang et al. |
| 2013/0249101 A1 | 9/2013 | Lin et al. |

(56) References Cited

U.S. PATENT DOCUMENTS

| | | |
|---|---|---|
| 2013/0249115 A1 | 9/2013 | Lin et al. |
| 2013/0292833 A1* | 11/2013 | Won ................ H01L 23/3128 257/738 |
| 2013/0341784 A1 | 12/2013 | Lin et al. |
| 2014/0048906 A1 | 2/2014 | Shim et al. |
| 2014/0048913 A1 | 2/2014 | Park et al. |
| 2014/0103524 A1 | 4/2014 | Kurita |
| 2014/0103527 A1 | 4/2014 | Marimuthu et al. |
| 2014/0307394 A1 | 10/2014 | LoBianco |
| 2014/0308907 A1 | 10/2014 | Chen |
| 2014/0346681 A1 | 11/2014 | Kurita |
| 2015/0008575 A1* | 1/2015 | Liu ..................... H01L 24/16 257/737 |
| 2015/0022985 A1* | 1/2015 | Na ..................... H05K 1/183 361/764 |
| 2015/0126134 A1 | 5/2015 | LoBianco |
| 2015/0130041 A1* | 5/2015 | Seo ................ H01L 23/3128 438/109 |
| 2015/0137348 A1 | 5/2015 | Kurita |
| 2015/0206869 A1* | 7/2015 | Kim ............... H01L 23/49816 438/109 |
| 2015/0255415 A1 | 9/2015 | De Bonis et al. |
| 2016/0013175 A1 | 1/2016 | Lee et al. |
| 2016/0035593 A1 | 2/2016 | Read |
| 2016/0035678 A1 | 2/2016 | Yoo et al. |
| 2016/0035679 A1 | 2/2016 | Chen |
| 2016/0099192 A1* | 4/2016 | Chen ................ H01L 21/6836 361/772 |
| 2016/0111375 A1 | 4/2016 | Bair |
| 2016/0161992 A1 | 6/2016 | Kwon |
| 2016/0260690 A1 | 9/2016 | Ganesan et al. |
| 2016/0276307 A1 | 9/2016 | Lin |
| 2016/0307875 A1 | 10/2016 | Kurita |
| 2017/0025361 A1 | 1/2017 | Lee et al. |
| 2017/0040293 A1 | 2/2017 | Kim et al. |
| 2017/0042069 A1 | 2/2017 | LoBianco |
| 2017/0084549 A1 | 3/2017 | Chen et al. |
| 2017/0098634 A1 | 4/2017 | Kumar et al. |
| 2017/0117184 A1 | 4/2017 | Liu |
| 2017/0149466 A1 | 5/2017 | LoBianco |
| 2017/0179039 A1 | 6/2017 | Lee et al. |
| 2017/0207152 A1 | 7/2017 | De Bonis et al. |
| 2017/0317710 A1 | 11/2017 | Liu |
| 2017/0345862 A1 | 11/2017 | Kinsman |
| 2018/0096949 A1 | 4/2018 | Chen |
| 2018/0096950 A1 | 4/2018 | Chen |
| 2018/0096951 A1 | 4/2018 | Chen |
| 2018/0146541 A1 | 5/2018 | Chen |
| 2018/0218922 A1 | 8/2018 | Darveaux |
| 2018/0226271 A1 | 8/2018 | Chen |
| 2018/0226272 A1 | 8/2018 | Darveaux |
| 2018/0226273 A1 | 8/2018 | Darveaux |
| 2018/0226274 A1 | 8/2018 | Darveaux |
| 2018/0226363 A1 | 8/2018 | Chen et al. |
| 2018/0240763 A1 | 8/2018 | Chen |
| 2019/0131254 A1 | 5/2019 | Chen et al. |

FOREIGN PATENT DOCUMENTS

| | | |
|---|---|---|
| JP | 2016-119331 | 6/2016 |
| KR | 10-2013-0084866 | 7/2013 |
| KR | 20130074869 | 7/2013 |
| KR | 10-2014-0124340 | 10/2014 |
| KR | 10-2015-0002264 | 1/2015 |
| KR | 20150000173 | 1/2015 |
| KR | 10-2016-0014913 | 2/2016 |
| TW | 201230284 | 7/2012 |

* cited by examiner

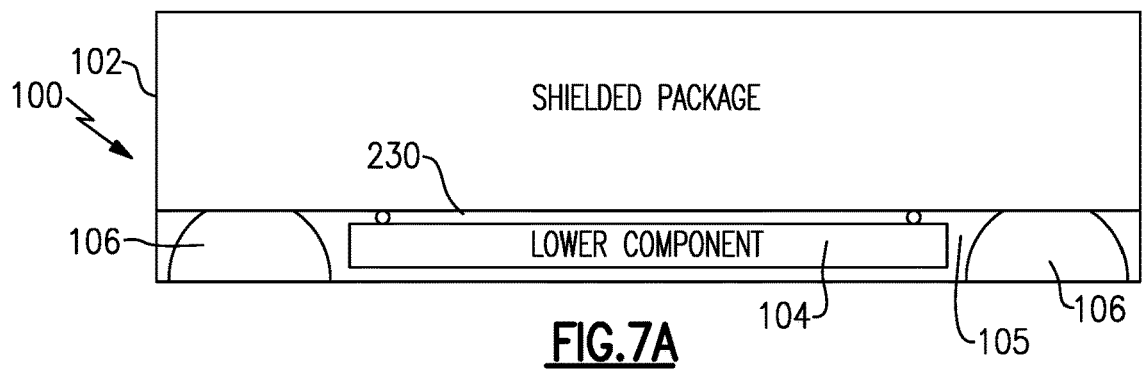
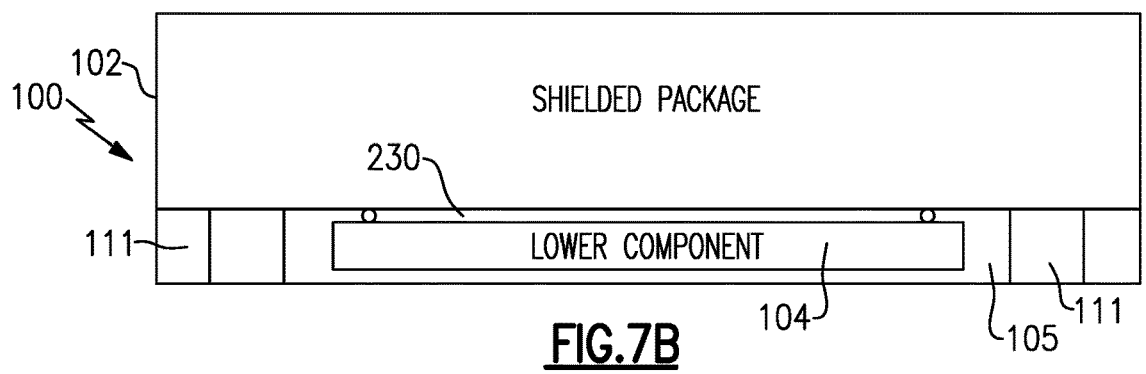
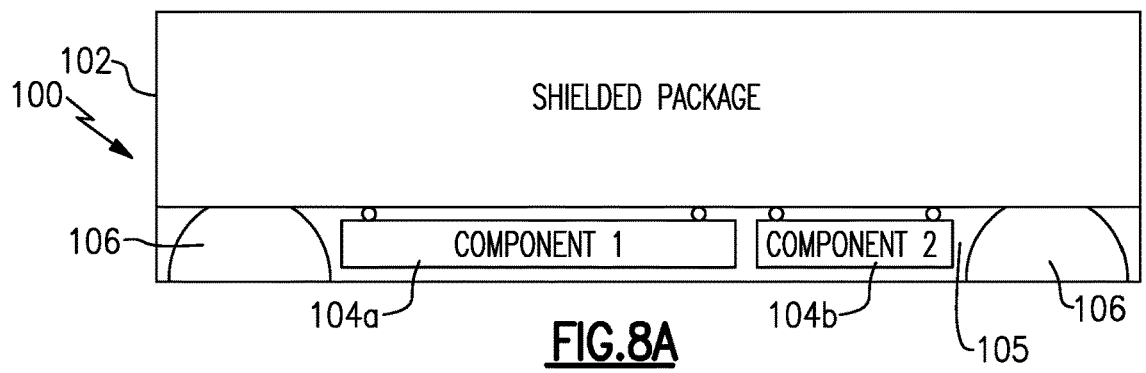
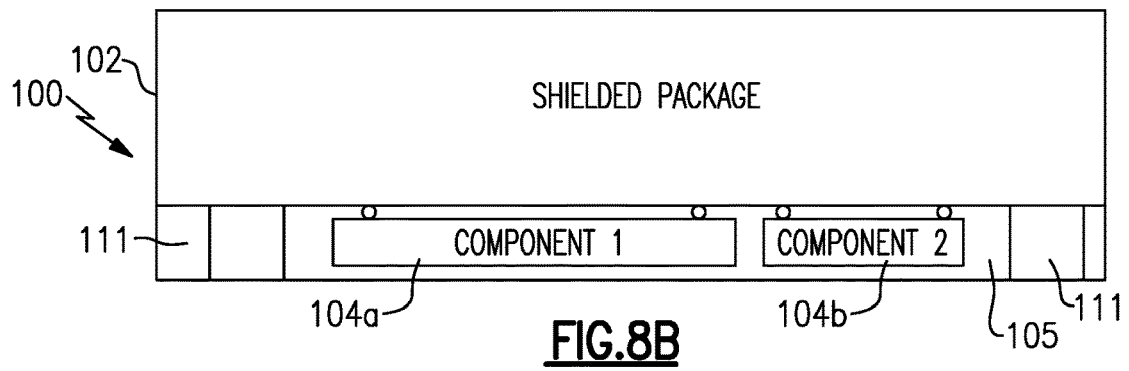

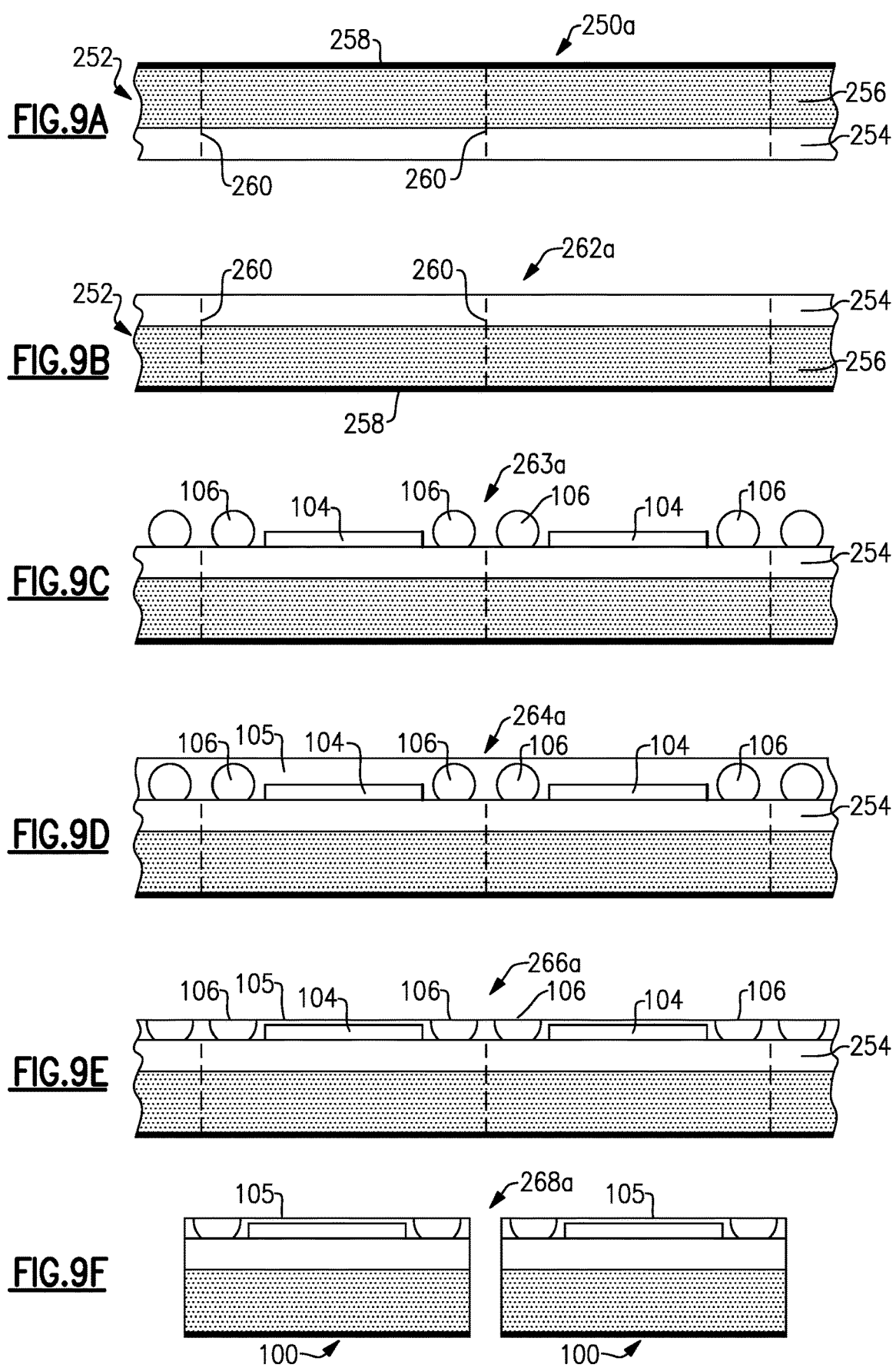

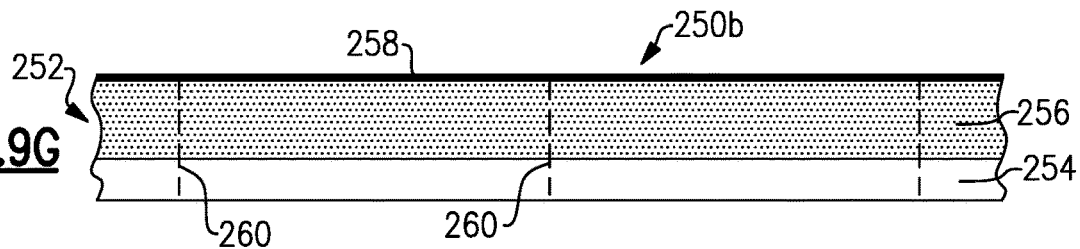
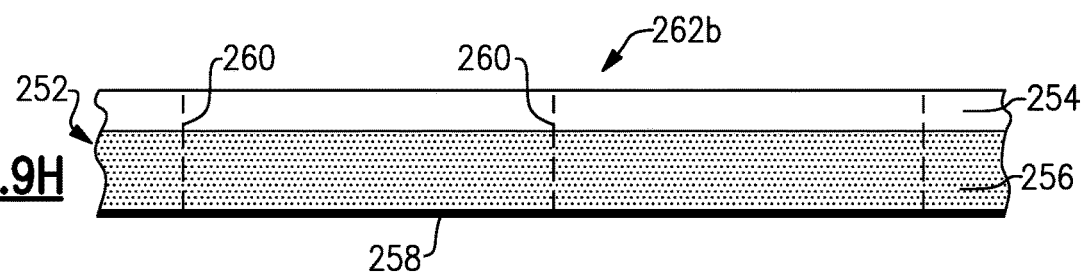
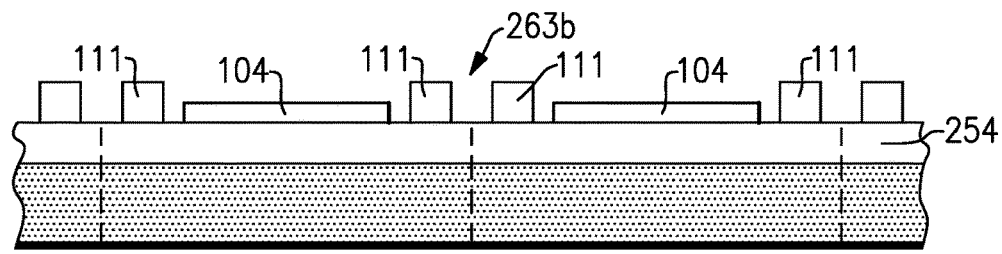
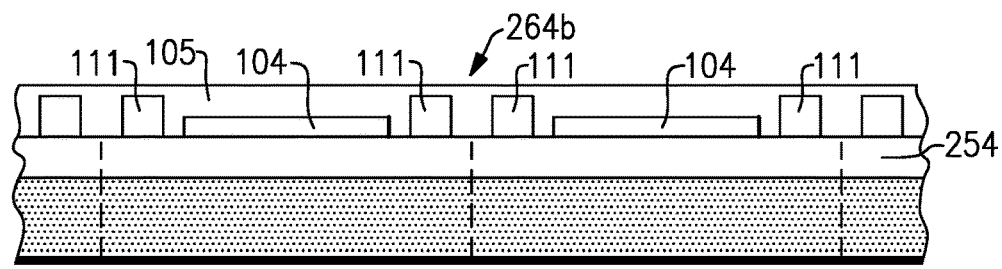
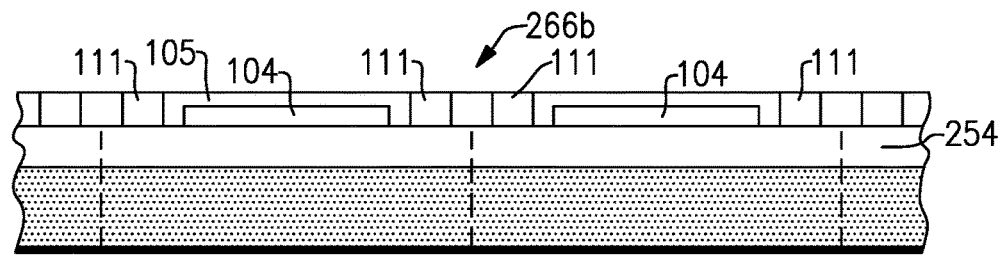
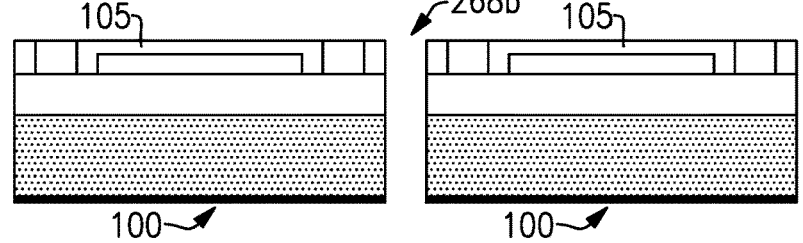

DEVICES AND METHODS RELATED TO DUAL-SIDED RADIO-FREQUENCY PACKAGE WITH OVERMOLD STRUCTURE

CROSS-REFERENCE TO RELATED APPLICATION(S)

This application is a continuation of U.S. patent application Ser. No. 16/833,625, filed Mar. 29, 2020, entitled "DUAL-SIDED RADIO-FREQUENCY PACKAGE WITH OVERMOLD STRUCTURE," now U.S. Pat. No. 11,127,690, issued Sep. 21, 2021, which is a continuation of U.S. patent application Ser. No. 15/724,722, filed Oct. 4, 2017, entitled "DUAL-SIDED RADIO-FREQUENCY PACKAGE WITH OVERMOLD STRUCTURE," now U.S. Pat. No. 10,607,944, issued Mar. 31, 2020, which claims priority to U.S. Provisional Application No. 62/404,015, filed Oct. 4, 2016, entitled "DUAL-SIDED RADIO-FREQUENCY PACKAGE WITH OVERMOLD STRUCTURE," U.S. Provisional Application No. 62/404,022, filed Oct. 4, 2016, entitled "RADIO-FREQUENCY DEVICE WITH DUAL-SIDED OVERMOLD STRUCTURE," and U.S. Provisional Application No. 62/404,029, filed Oct. 4, 2016, entitled "CIRCUITS AND METHODS RELATED TO RADIO-FREQUENCY DEVICES WITH DUAL-SIDED OVERMOLD STRUCTURE," the disclosure of each of which is hereby expressly incorporated by reference herein in its entirety.

BACKGROUND

Field

The present disclosure generally relates to packaging of circuit devices.

Description of the Related Art

The present disclosure relates to fabrication of packaged electronic modules such as radio-frequency (RF) modules. In radio-frequency (RF) applications, RF circuits and related devices can be implemented in a packaged module. Such a packaged module can then be mounted on a circuit board such as a phone board.

SUMMARY

In accordance with some implementations, the present disclosure relates to a packaged radio-frequency (RF) device. The packaged radio-frequency device includes a packaging substrate configured to receive one or more components, the packaging substrate including a first side and a second side. The packaged radio-frequency device also includes a shielded package implemented on the first side of the packaging substrate, the shielded package including a first circuit and a first overmold structure, and the shielded package configured to provide radio-frequency shielding for at least a portion of the first circuit. The packaged radio-frequency device further includes a set of through-mold connections implemented on the second side of the packaging substrate, the set of through-mold connections defining a mounting volume on the second side of the packaging substrate, a component implemented within the mounting volume and a second overmold structure substantially encapsulating one or more of the component or the set of through-mold connections.

In some embodiments, at least a portion of the set of through-mold connections is exposed through the second overmold structure. In some embodiments, the set of through-mold connections comprises a metallic material. In some embodiments, the set of through-mold connections comprises a set of pillars configured to allow the packaged radio-frequency device to be mounted on a circuit board. In some embodiments, the first and second sides of the packaging substrate correspond to upper and lower sides, respectively, when the packaged radio-frequency device is oriented to be mounted on a circuit board. In some embodiments, the set of through-mold connections comprises a ball grid array configured to allow the packaged radio-frequency device to be mounted on a circuit board.

In some embodiments, the ball grid array includes a first group of solder balls arranged to partially or fully surround the component mounted on the lower side of the packaging substrate. In some embodiments, the ball grid array further includes a second group of solder balls arranged to partially or fully surrounds the first group of solder balls. In some embodiments, at least some of the first group of solder balls are electrically connected to input and output nodes of the first circuit. In some embodiments, each of the second group of solder balls is electrically connected to a ground plane within the packaging substrate.

In some embodiments, the first group of solder balls forms a rectangular perimeter around the component mounted on the lower side of the packaging substrate. In some embodiments, the second group of solder balls forms a rectangular perimeter around the first group of solder balls.

In some embodiments, the packaging substrate includes a laminate substrate. In some embodiments, the packaging substrate includes a ceramic substrate. In some embodiments, the ceramic substrate includes a low-temperature co-fired ceramic substrate.

In some embodiments, the first overmold structure substantially encapsulates the first circuit. In some embodiments, the shielded package further includes an upper conductive layer implemented on the first overmold structure, the upper conductive layer electrically connected to a ground plane within the packaging substrate. In some embodiments, the electrical connection between the upper conductive layer and a ground plane is achieved through one or more conductors within the first overmold structure.

In some embodiments, the one or more conductors include shielding wirebonds arranged relative to the first circuit to provide RF shielding functionality for at least a portion of the first circuit. In some embodiments, the one or more conductors include one or more surface-mount technology devices mounted on the packaging substrate, the one or more surface-mount technology devices arranged relative to the first circuit to provide radio-frequency shielding functionality for at least a portion of the first circuit.

In some embodiments, the electrical connection between the upper conductive layer and a ground plane is achieved through a conformal conductive coating implemented on one or more sides of the first overmold structure. In some embodiments, the conformal conductive coating extends to corresponding one or more sides of the packaging substrate.

In some embodiments, the packaging substrate includes one or more conductive features each having a portion exposed at the corresponding side of the packaging substrate to form an electrical connection with the conformal conductive coating, each conductive feature further connected to the ground plane within the substrate packaging.

In some embodiments, the upper conductive layer is a conformal conductive layer. In some embodiments, the conformal conductive layer substantially covers all four sides of the first overmold structure and all four sides of the packaging substrate. In some embodiments, the conformal conductive coating is implemented on one or more sides of the first overmold structure. In some embodiments, the conformal conductive layer substantially covers all four sides of the first overmold structure.

In some embodiments, the component includes a surface-mount technology device. In some embodiments, the surface-mount technology device includes a passive device or an active radio-frequency device. In some embodiments, the component includes a die. In some embodiments, the die includes a semiconductor die. In some embodiments, the semiconductor die is configured to facilitate processing of radio-frequency signals by the first circuit.

The present disclosure also relates to a wireless device. The wireless device includes a circuit board configured to receive a plurality of packaged modules. The wireless device further includes a shielded radio-frequency module mounted on the circuit board, the radio-frequency module including a packaging substrate configured to receive a plurality of components, the packaging substrate including a first side and a second side, the radio-frequency module further including a shielded package implemented on the first side of the packaging substrate, the shielded package including a first circuit and a first overmold structure, the shielded package configured to provide radio-frequency shielding for at least a portion of the first circuit, the radio-frequency module further including a set of through-mold connections implemented on the second side of the packaging substrate, the set of through-mold connections defining a mounting volume on the second side of the packaging substrate, the radio-frequency module further including a component implemented within the mounting volume and a second overmold structure substantially encapsulating one or more of the component or the set of through-mold connections.

The present disclosure also relates to a method for manufacturing packaged radio-frequency (RF) devices. The method includes providing a packaging substrate configured to receive a plurality of components, the packaging substrate including a first side and a second side. The method further includes forming a shielded package on the first side of the packaging substrate, the shielded package including a first circuit and a first overmold structure, the shielded package configured to provide RF shielding for at least a portion of the first circuit. The method further includes mounting a component on the second side of the packaging substrate, and arranging a set of through-mold connections on the second side of the packaging substrate such that the set of through-mold connections is positioned relative to the component. The method also includes forming a second overmold structure over the component and the set of through-mold connections and removing a portion of the second overmold structure.

In some embodiments, removing the portion of the second overmold structure comprises ablating the portion of the second overmold structure. In some embodiments, ablating the portion of the second overmold structure exposes the set of through-mold connections through the second overmold structure. In some embodiments, removing the portion of the second overmold structure comprises removing portions of the set of through-mold connections. In some embodiments, removing the portion of the second overmold structure comprises removing a film of overmold material from the set of through-mold connections. In some embodiments, removing the portion of the second overmold structure comprises removing overmold material in areas surrounding the set of through-mold connections.

In some embodiments, the first overmold structure substantially encapsulates the first circuit. In some embodiments, the set of through-mold connections comprises a metallic material. In some embodiments, the set of through-mold connections is configured to allow the packaged RF device to be mounted on a circuit board. In some embodiments, arranging the set of through-mold connections comprises arranging a first group of through-mold connections to partially or fully surround the component mounted on the lower side of the packaging substrate. In some embodiments, arranging the set of through-mold connections further comprises arranging a second group of through-mold connections to partially or fully surround the first group of through-mold connections.

In some embodiments, the method further includes electrically connecting at least some of the first group of through-mold connections to input and output nodes of the first circuit. In some embodiments, the method further includes electrically connecting at least some of the second group of through-mold connections to a ground plane within the packaging substrate.

In some embodiments, the packaging substrate includes a laminate substrate. In some embodiments, the packaging substrate includes a ceramic substrate. In some embodiments, the ceramic substrate includes a low-temperature co-fired ceramic (LTCC) substrate.

The present disclosure also relates to a method for manufacturing packaged radio-frequency (RF) devices. The method includes providing a packaging substrate panel an array of units, the packaging substrate panel including a first side and a second side and forming a package on the first side of the packaging substrate panel to yield a packaged panel and such that each unit includes a first circuit and a first overmold structure. The method further includes performing at least one processing operation on the second side of the packaging substrate to yield a dual-sided panel, the second side of the packaging substrate including a second component and a second overmold structure. The method also includes singulating the dual-sided panel to yield a plurality of individual dual-sided packages and forming a conformal shielding layer for each of the individual dual-sided packages arranged in a frame such that a conformal shielding layer covers an upper surface and at least one side wall of the individual dual-sided package.

In some embodiments, the at least one processing operation on the second side comprises mounting a component for each unit on the second side of the packaging substrate. In some embodiments, the at least one processing operation on the second side further comprises arranging a set of through-mold connections for each unit relative to the component on the second side of the packaging substrate. In some embodiments, the at least one processing operation on the second side further comprises forming the second overmold structure over the component and the set of through-mold connections. In some embodiments, the at least one processing operation on the second side further comprises removing a portion of the second overmold structure.

In some embodiments, removing the portion of the second overmold structure comprises ablating the portion of the second overmold structure. In some embodiments, ablating the portion of the second overmold structure exposes the set of through-mold connections through the second overmold structure. In some embodiments, removing the portion of the second overmold structure comprises removing portions of the set of through-mold connections. In some embodiments, removing the portion of the second overmold structure comprises removing a film of overmold material from the set of through-mold connections. In some embodiments, removing the portion of the second overmold structure comprises removing overmold material in areas surrounding the set of through-mold connections.

In some embodiments, the set of through-mold connections comprises a ball grid array (BGA). In some embodiments, the conformal shielding layer covers substantially all of the side walls of the individual dual-sided package. In some embodiments, each of the individual dual-sided packages is held on the frame by a tape. In some embodiments, the forming of the conformal shielding layer includes a sputter deposition process.

In some embodiments, the frame has a rectangular shape configured to hold the individual dual-sided packages in a rectangular array. In some embodiments, the frame has a wafer-like format suitable for the sputter deposition process. In some embodiments, the individual dual-sided packages are arranged in a selected ring region on the wafer-like frame.

The present disclosure relates to a method for manufacturing packaged radio-frequency (RF) devices. The method includes providing a packaging substrate configured to receive a plurality of components, the packaging substrate including a first side and a second side and forming a shielded package on the first side of the packaging substrate, the shielded package including a first circuit and a first overmold structure, the shielded package configured to provide RF shielding for at least a portion of the first circuit. The method further includes mounting a component on the second side of the packaging substrate and forming a second overmold structure over the component. The method includes forming a set of cavities in the second overmold structure, the set of cavities positioned relative to the component and forming a set of through-mold connections in the set of cavities in the second overmold structure.

In some embodiments, the shielded package comprises a second overmold structure that substantially encapsulates the first circuit. In some embodiments, the set of through-mold connections comprises a metallic material. In some embodiments, the set of through-mold connections is configured to allow the packaged RF device to be mounted on a circuit board.

In some embodiments, forming the set of cavities comprises forming a first group of cavities vias to partially or fully surround the component mounted on the lower side of the packaging substrate. In some embodiments, forming the set of cavities further comprises forming a second group of cavities to partially or fully surround the first group of cavities. In some embodiments, the method further includes electrically connecting at least some of the set of through-mold connections to a ground plane within the packaging substrate. In some embodiments, the method further includes forming additional conductive material on the set of through-mold connections.

In some embodiments, the packaging substrate includes a laminate substrate. In some embodiments, the packaging substrate includes a ceramic substrate. In some embodiments, the ceramic substrate includes a low-temperature co-fired ceramic (LTCC) substrate.

The present disclosure also relates to a method for manufacturing packaged radio-frequency (RF) devices. The method includes providing a packaging substrate panel an array of units, the packaging substrate panel including a first side and a second side and forming a package on the first side of the packaging substrate panel to yield a packaged panel and such that each unit includes a first circuit and a first overmold structure. The method further includes performing at least one processing operation on the second side of the packaging substrate to yield a dual-sided panel, the second side of the packaging substrate including a second component and a second overmold structure and singulating the dual-sided panel to yield a plurality of individual dual-sided packages.

In some embodiments, the method further includes forming a conformal shielding layer for each of the individual dual-sided packages arranged in a frame such that a conformal shielding layer covers an upper surface and at least one side wall of the individual dual-sided package.

In some embodiments, the at least one processing operation on the second side comprises mounting a component for each unit on the second side of the packaging substrate. In some embodiments, the at least one processing operation on the second side further comprises forming a second overmold structure over the component. In some embodiments, the at least one processing operation on the second side further comprises forming a set of cavities in the second overmold structure, the set of cavities positioned relative to the component. In some embodiments, the at least one processing operation on the second side further comprises forming a set of through-mold connections in the set of cavities in the second overmold structure.

In some embodiments, the set of through-mold connections comprises a ball grid array (BGA). In some embodiments, the conformal shielding layer covers substantially all of the side walls of the individual dual-sided package. In some embodiments, each of the individual dual-sided packages is held on the frame by a tape. In some embodiments, the forming of the conformal shielding layer includes a sputter deposition process.

In some embodiments, the frame has a rectangular shape configured to hold the individual dual-sided packages in a rectangular array. In some embodiments, the frame has a wafer-like format suitable for the sputter deposition process. In some embodiments, the individual dual-sided packages are arranged in a selected ring region on the wafer-like frame.

BRIEF DESCRIPTION OF THE DRAWINGS

FIG. 7A illustrates a dual-sided package implementing a BGA-mounted device and solder balls, according to some implementations.

FIG. 7B illustrates a dual-sided package implementing a BGA-mounted device and pillars, according to some implementations.

FIG. 8A illustrates a dual-sided package implementing a plurality of lower components, according to some implementations.

FIG. 8B illustrates a dual-sided package implementing a plurality of lower components, according to some implementations.

FIGS. 9A-9L illustrate various stages of fabrication processes for implementing dual-sided packages, according to some implementations.

DETAILED DESCRIPTION OF SOME EMBODIMENTS

The headings provided herein, if any, are for convenience only and do not necessarily affect the scope or meaning of the claimed invention.

The present disclosure relates to fabrication of packaged electronic modules such as radio-frequency (RF) modules. In radio-frequency (RF) applications, RF circuits and related devices can be implemented in a packaged module. Such a packaged module can then be mounted on a circuit board such as a phone board.

Figure 1:
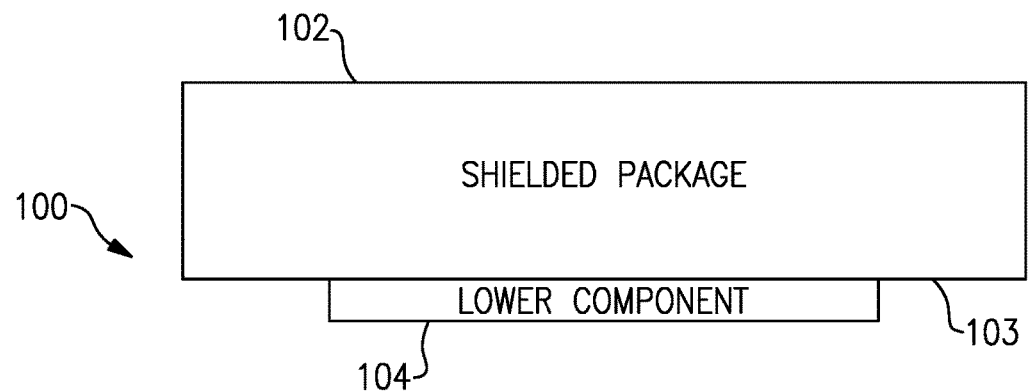
FIG. 1 illustrates a dual-sided package having a shielded package and a lower component mounted thereto, according to some implementations.

FIG. 1 shows a dual-sided package 100 having a shielded package 102 and a lower component 104 mounted thereto. For the purpose of description, a lower side of the shielded package 102 can include a side 103 of a packaging substrate that is to be mounted onto a circuit board such as a phone board. Although not shown separately in FIG. 1, it will be understood that the shielded package 102 can include such a packaging substrate and one or more upper components mounted on its upper side (when oriented as shown in FIG. 1). Accordingly, the dual-side property can include such upper component(s) mounted over the substrate and lower component(s) mounted under the substrate.

For the purpose of description, it will be understood that a lower component can include any device that can be mounted on the substrate and/or the circuit board. Such a device can be an active radio-frequency (RF) device or a passive device that facilitates processing of RF signals. By way of non-limiting examples, such a device can include a die such as a semiconductor die, an integrated passive device (IPD), a surface-mount technology (SMT) device, and the like. In some embodiments, the lower component as described herein can be electrically coupled to the one or more upper component through, for example, the substrate.

Figure 2:
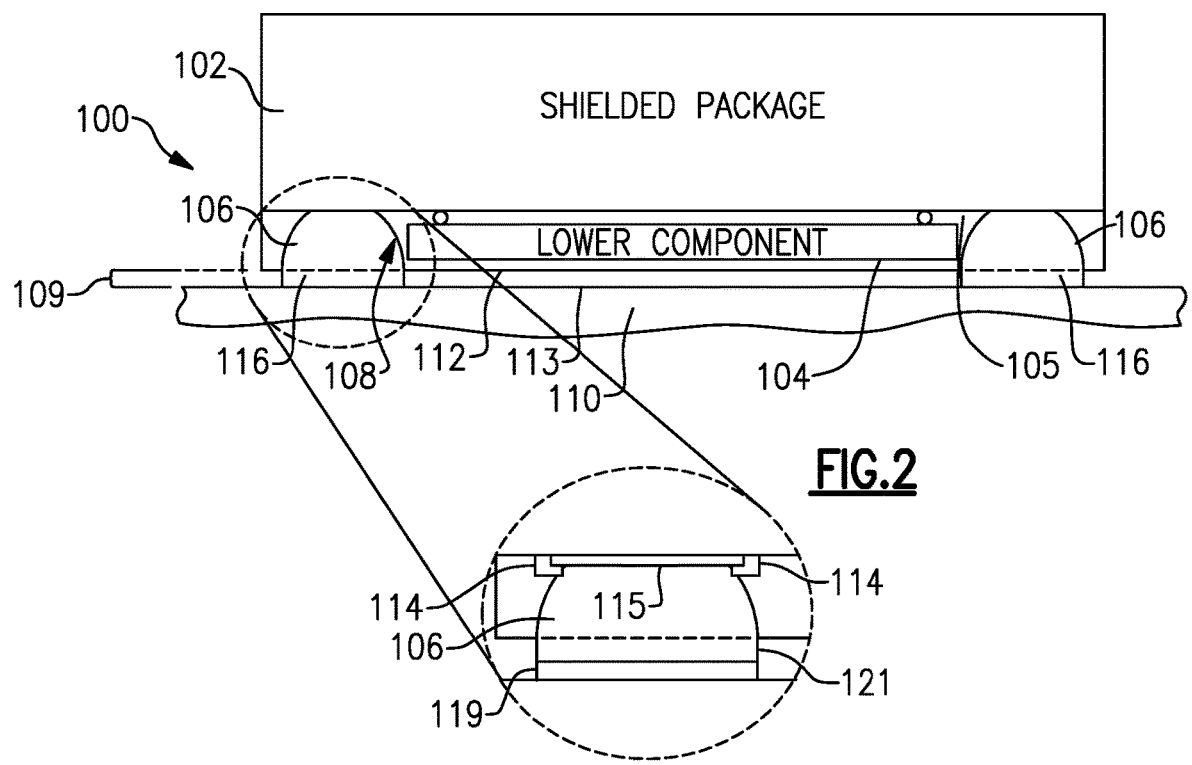
FIG. 2 illustrates a dual-sided package having a shielded package and one or more lower components mounted within a volume defined on an underside of the shielded package, according to some implementations.

FIG. 2 shows that in some embodiments, one or more lower components can be mounted under a shielded package, generally within a volume defined on an underside of the shielded package. In one embodiment, a set of through-mold connections (e.g., one or more through-mold connections) may be implemented, formed, located, and/or positioned on the underside (e.g., side 103 illustrated in FIG. 1) of the shielded package 102. The set of through-mold connections may define a volume on the underside of the shielded package 102. In FIG. 2, a volume 108 under a shielded package 102 is shown to be defined by the underside of the shielded package 102 and solder balls 106 of a ball grid array (BGA). The BGA may be a set of through-mold connections. For example, each solder ball 106 of the BGA may be a through-mold connection in the set of through-mold connections. Other examples of through-mold connections include, but are not limited to solder balls, pillars, columns, posts, pedestals, etc. The through-mold connections described herein may also be referred to as contact features. The solder balls 106 are shown to allow the dual-sided package 100 to be mounted on a circuit board 110 such as a phone board. The solder balls 106 can be configured so that when mounted to the circuit board 110, there is sufficient vertical space between the upper surface of the circuit board 110 and the lower surface of the shielded package 102 for the lower component 104. As illustrated in FIG. 2, the volume 108 is at least partially filled with an overmold 105. The overmold 105 substantially encapsulates the lower component 104. In one embodiment, at least a portion of the solder balls 106 may be exposed through the overmold 105. Exposing at least a portion of the solder balls 106 may provide a connection (e.g., an electrical and/or thermal connection) through the overmold 105. For example, the solder balls 106 may provide a connection (e.g., an electrical connection) to the lower component 104 and/or components in the shield package 102. In one embodiment, solder (or other conductive material) may be applied to the exposed portion of the solder balls 106 to form a connection (e.g., electrical connection) with the circuit board 110. The overmold 105 may also be referred to as an overmold structure. In one embodiment, the overmold 105 and/or the solder balls 106 (e.g., the exposed portions of the solder balls 106) may form a land grid array (LGA) type/style package.

A close-up view of the solder ball 106 is also illustrated in FIG. 2. As illustrated in the close-up view of the solder ball 106, the bottom of the shielded package includes a pad 115. The pad 115 may be a metallic pad (or some other material) that may provide electrical and/or thermal conductivity between the solder ball 106 and components of the shield package 102 and/or the lower component 104. Solder mask 114 may be deposited over portions of the pad 115 to define a location where the solder ball 106 may be formed. The solder ball 106 may be formed (e.g., implemented, formed, dropped, etc.) on top of the pad 115 and the solder mask 114.

The dual-sided package 100 may be installed on the circuit board 110 using the solder ball 106. The solder ball 106 may be attached to the circuit board 110 (e.g., may be installed, mounted, fixed, etc., to the circuit board 110) via connection 116. As illustrated in the close-up view of the solder ball 106, the connection 116 may include solder material 121 and pad 119. The solder material 121 may be solder material from the solder ball 106 that is deposited/melted onto the pad 119 when the dual-sided package 100 is attached to the circuit board. For example, during a reflow process, heat may be applied to melt at least a portion of the solder ball 106 to form the solder material 121. The solder material 121 may also include additional material that is formed, implemented, deposited, etc., over the solder ball 106. For example, the solder material 121 may include solder material 118, illustrated in FIGS. 13B and 13C, and discussed in more detail below. The pad 119 may be part of the circuit board 110. The pad 119 may provide electrical and/or thermal conductivity between the dual-sided package 100 and other components/circuits attached to the circuit board 110 (not illustrated in the figures). In one embodiment, the pad 119 may include solder material.

As illustrated in FIG. 2, the overmold 105 has a surface 112 (facing downward toward the circuit board 110). In one embodiment, the surface 112 may not contact (e.g., may not physically touch) the surface 113 of the circuit board 110. As illustrated in FIG. 2, a gap 109 is present between the surface 112 and the surface 113. In one embodiment, the gap 109 may help protect the lower component 104 from damage when there are linear displacements of the dual-sided package 100 due to flexing or dropping. For example, the gap 109 may help protect the lower component 104 from damage as the dual-sided package 100 is installed on the circuit board 100 (e.g., may prevent the lower component 104 from contacting the surface 113 of the circuit board 110 during installation/mounting of the dual-sided package). The portion of the overmold material 105 that covers the lower component 104 may provide additional protection from damage when there are linear displacements of the dual-sided package 100 due to flexing or dropping. For example, the overmold material 105 may also prevent the lower component 104 from contacting the surface 113 of the circuit board 110 during installation/mounting of the dual-sided package. In another embodiment, the gap 109 may also allow the dual-sided package to adapt to process/manufacturing variations when the dual-sided package 100 is installed on the circuit board 110. For example, different temperatures may be used to melt the solder ball 106 during installation of the dual-sided package. The gap 109 may help ensure that the dual-sided package is properly installed by providing enough distance between the surface 112 (of overmold 105) and the surface 113 (of circuit board 110) while still allowing the solder material of the solder ball 106 to properly bond with the pad 119 of the circuit board 110. In some embodiments, although the overmold 105 and/or the gap 109 may prevent the component 104 from contacting the surface 113 (of the circuit board 110), the dual-sided package 100 and/or the component 104 may still operate/function properly even if the component 104 does contact the surface 113. For example, the component 104 may remain undamaged and/or operable even after contacting the surface 113 of the circuit board 110.

Examples related to fabrication of dual-sided packages having such a configuration are described herein in greater detail. It will be understood that although such examples are described in the context of solder balls, other types of connection features that provide sufficient vertical space can also be utilized. Although the embodiments, examples, configurations, and/or implementations disclosed herein may refer to solder balls and/or a BGA, one having ordinary skill in the art understands that solder balls and/or a BGA are examples of through-mold connections. One having ordinary skill in the art understands that other types of through-mold connections (e.g., pillars, columns, etc.,) may be used to define a volume on an underside of a shielded package and an overmold may be implemented in the volume (on the underside of the shielded package). In one embodiment, a through-mold connection (or a set of through-mold connections) may be any structure and/or component that may be used to define a volume on the underside of a shielded package and/or may be used to support the shielded package above a surface.

Examples of Dual-Sided Packages with BGA

Figure 3:
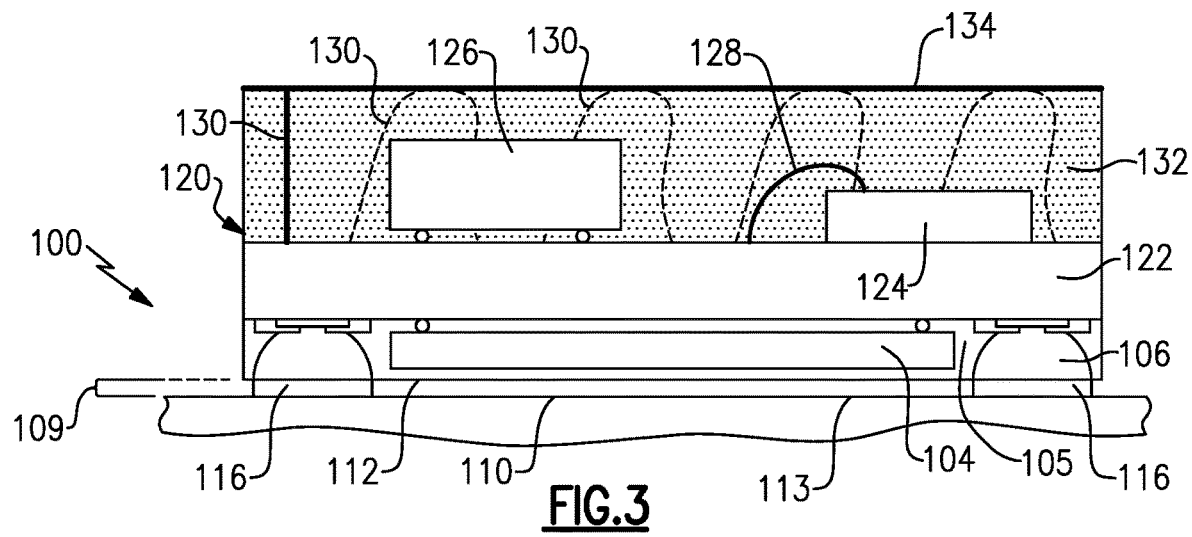
FIG. 3 illustrates a shielded package as a wire-shielded package, according to some implementations.
Figure 4:
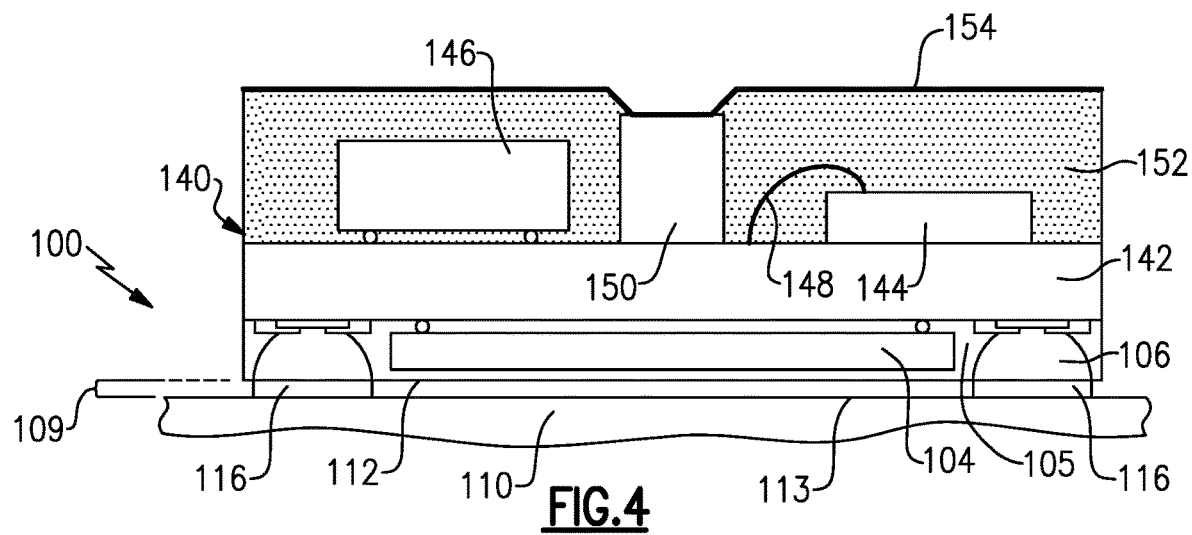
FIG. 4 illustrates a shielded package having a non-wire component that provides electrical connection between an upper conductive layer and a ground plane within a packaging substrate, according to some implementations.
Figure 5:
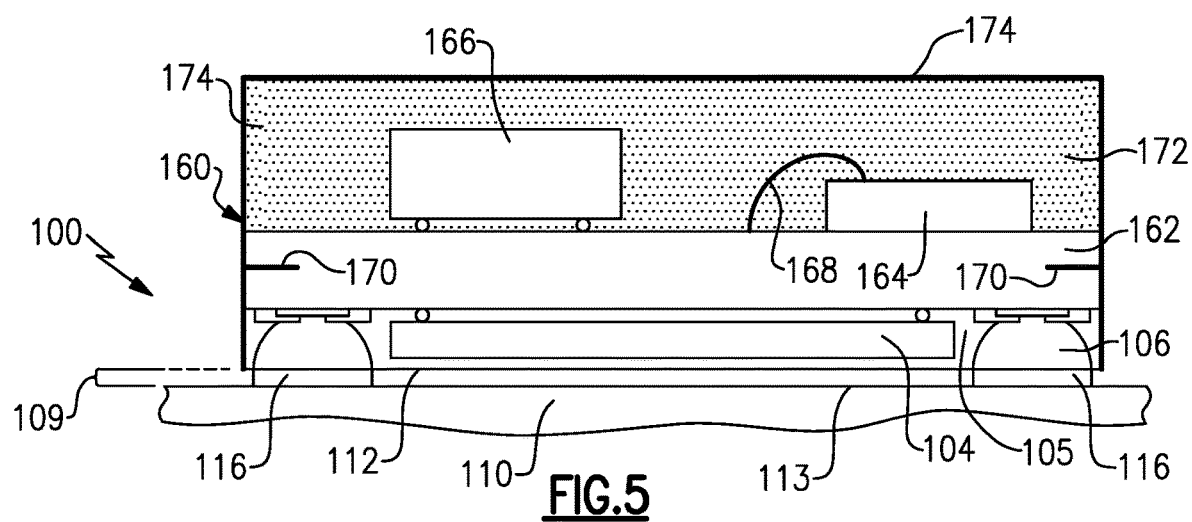
FIG. 5 illustrates a shielded package having a conformal conductive layer that is electrically connected to a ground plane within a packaging substrate, according to some implementations.

FIGS. 3-6 show non-limiting examples of dual-sided packages having BGAs. FIGS. 3-5 show examples of configurations of shielded packages that can be utilized. FIGS. 6A and 6B show an example of a BGA configuration that can be implemented. FIGS. 6C and 6D show an example of a pillar based (e.g., post, column) configuration that can be implemented.

FIG. 3 shows that in some embodiments, the shielded package 102 of FIG. 2 can be a wire-shielded package 120. The wire-shielded package 120 is shown to include a packaging substrate 122 (e.g., a laminate substrate) and a plurality of components mounted thereon. For example, a first component 124 is depicted as being mounted on the upper surface of the packaging substrate 122, and electrical connections between the component 124 and the packaging substrate 122 can be facilitated by, for example, wirebonds 128. In another example, a second component 126 is shown to be mounted on the upper surface of the packaging substrate 122 in a die-attach configuration. Electrical connections between the component 126 and the packaging substrate 122 can be facilitated by, for example, die-attach features.

In the example of FIG. 3, a plurality of shielding wires 130 (e.g. shielding wirebonds) are shown to be provided over the packaging substrate 122. Such shielding wires 130 can be electrically connected to a ground plane (not shown) within the packaging substrate 122. The shielding wires 130 as well as the mounted components 124, 126 are shown to be encapsulated by an overmold 132. The upper surface of the overmold 132 can be configured to expose the upper portions of the shielding wires 130, and an upper conductive layer 134 can be formed thereon. Accordingly, a combination of the upper conductive layer 134, the shielding wires 130, and the ground plane can define a shielded volume or region. Such a configuration can be implemented to provide shielding functionality between regions within and outside of the shielded package 120, and/or between regions that are both within the shielded package 120. Additional details concerning such shielding can be found in, for example, U.S. Pat. No. 8,373,264 entitled SEMICONDUCTOR PACKAGE WITH INTEGRATED INTERFERENCE SHIELDING AND METHOD OF MANUFACTURE THEREOF which is expressly incorporated by reference in its entirety for all purposes.

In the example of FIG. 3, an array of solder balls 106 is shown to be implemented on the underside of the packaging substrate 122 so as to define an underside volume. A lower component 104 is shown to be mounted within such an underside volume to thereby form a dual-sided package 100. An overmold 105 may be formed and/or implemented in the underside volume (where the lower component 104 is located) formed by the solder balls 106 (e.g., formed by a set of through-mold connections, such as a BGA). In one embodiment, the overmold 105 may encapsulate at least a portion of the lower component 104. For example, the overmold 105 may fully or partially encapsulate the lower component 104. In another embodiment, the overmold 105 may encapsulate at least a portion of the solder balls 106 (e.g., through-mold connections). For example, the overmold 105 may fully or partially encapsulate the solder balls 106. In FIG. 3, the dual-sided package 100 is shown to be mounted on a circuit board 110 such as a phone board. As discussed above, the overmold 105 and/or the solder balls 106 (e.g., the exposed portions of the solder balls 106) may form a land grid array (LGA) type/style package. As illustrated in FIG. 3, the solder balls 106 may have a semicircular shape. For example, the bottom portion of the solder balls 106 may be removed to form the semicircular shape. The semicircular shape of the solder balls 106 may be formed during a manufacturing process, as discussed in more detail below.

As illustrated in FIG. 3, the dual-sided package 100 may be attached to the circuit board 110 via connections 116. A close-up view of the solder balls 106 and the connections 116, and additional details (of the solder balls 106 and the connections 116) are illustrated/discussed above in conjunction with FIG. 2. Also as illustrated in FIG. 3, a gap 109 is present between the surface 112 and the surface 113 of the circuit board 110. The gap 109 may help protect the lower component 104 from damage when there are linear displacements of the dual-sided package 100 due to flexing or dropping, as discussed above. The gap 109 may also allow the dual-sided package to adapt to process/manufacturing variations when the dual-sided package 100 is installed on the circuit board 110, as discussed above.

FIG. 4 shows that in some embodiments, the shielded package 102 of FIG. 2 can be a shielded package 140 having a non-wire component 150 that provides electrical connection between an upper conductive layer 154 and a ground plane (not shown) within a packaging substrate 142 (e.g., a laminate substrate). In addition to the component 150, the packaging substrate 142 is shown to have a plurality of components mounted thereon. For example, a first component 144 is depicted as being mounted on the upper surface of the packaging substrate 142, and electrical connections between the component 144 and the packaging substrate 142 can be facilitated by, for example, wirebonds 148. In another example, a second component 146 is shown to be mounted on the upper surface of the packaging substrate 142 in a die-attach configuration. Electrical connections between the component 146 and the packaging substrate 142 can be facilitated by, for example, die-attach features.

In the example of FIG. 4, the component 150 is shown to provide an electrical connection between the upper conductive layer 154 and the ground plane (not shown) within the packaging substrate 142. The component 150 as well as the mounted components 144, 146 are shown to be encapsulated by an overmold 152. The upper surface of the overmold 152 can be configured to expose the upper portion of the component 150, and the upper conductive layer 154 can cover such an exposed portion as well as the remaining upper surface of the overmold 152. Accordingly, a combination of the upper conductive layer 154, the component 150, and the ground plane can define a shielded volume or region. Such a configuration can be implemented to provide shielding functionality between regions within and outside of the shielded package 140, and/or between regions that are both within the shielded package 140. Additional details concerning such shielding can be found in, for example, U.S. patent application Ser. No. 14/252,719 filed on Apr. 14, 2014, entitled APPARATUS AND METHODS RELATED TO CONFORMAL COATING IMPLEMENTED WITH SURFACE MOUNT DEVICES, which is expressly incorporated by reference in its entirety.

In the example of FIG. 4, an array of solder balls 106 is shown to be implemented on the underside of the packaging substrate 142 so as to define an underside volume. A lower component 104 is shown to be mounted within such an underside volume to thereby form a dual-sided package 100. An overmold 105 may be formed and/or implemented in the underside volume (where the lower component 104 is located) formed by the solder balls 106 (e.g., formed by a set of through-mold connections, such as a BGA). In one embodiment, the overmold 105 may encapsulate at least a portion of the lower component 104. For example, the overmold 105 may fully or partially encapsulate the lower component 104. In another embodiment, the overmold 105 may encapsulate at least a portion of the solder balls 106 (e.g., through-mold connections). For example, the overmold 105 may fully or partially encapsulate the solder balls 106. In FIG. 4, the dual-sided package 100 is shown to be mounted on a circuit board 110 such as a phone board. As discussed above, the overmold 105 and/or the solder balls 106 (e.g., the exposed portions of the solder balls 106) may form a land grid array (LGA) type/style package. As illustrated in FIG. 4, the solder balls 106 may have a semicircular shape. For example, the bottom portion of the solder balls 106 may be removed to form the semicircular shape. The semicircular shape of the solder balls 106 may be formed during a manufacturing process, as discussed in more detail below.

As illustrated in FIG. 4, the dual-sided package 100 may be attached to the circuit board 110 via connections 116. A close-up view of the solder balls 106 and the connections 116, and additional details (of the solder balls 106 and the connections 116) are illustrated/discussed above in conjunction with FIG. 2. Also as illustrated in FIG. 3, a gap 109 is present between the surface 112 and the surface 113 of the circuit board 110. The gap 109 may help protect the lower component 104 from damage when there are linear displacements of the dual-sided package 100 due to flexing or dropping, as discussed above. The gap 109 may also allow the dual-sided package to adapt to process/manufacturing variations when the dual-sided package 100 is installed on the circuit board 110, as discussed above.

FIG. 5 shows that in some embodiments, the shielded package 102 of FIG. 2 can be a shielded package 160 having a conformal conductive layer 174 that is electrically connected to a ground plane (not shown) within a packaging substrate 162 (e.g., a laminate substrate or a ceramic substrate). The packaging substrate 162 is shown to have a plurality of components mounted thereon. For example, a first component 164 is depicted as being mounted on the upper surface of the packaging substrate 162, and electrical connections between the component 164 and the packaging substrate 162 can be facilitated by, for example, wirebonds 168. In another example, a second component 166 is shown to be mounted on the upper surface of the packaging substrate 162 in a die-attach configuration. Electrical connections between the component 166 and the packaging substrate 162 can be facilitated by, for example, die-attach features.

In the example of FIG. 5, the mounted components 164, 166 are shown to be encapsulated by an overmold 172. The conformal conductive layer 174 is shown to generally cover the upper surface of the overmold 172, as well as side walls (e.g., all four side walls) defined by the sides of the overmold 172 and the packaging substrate 162. The packaging substrate 162 is shown to include conductive features 170 having portions exposed on the sides of the packaging substrate, and also electrically connected to the ground plane (not shown), to thereby provide electrical connections between the conformal conductive layer 174 and the ground plane. Accordingly, a combination of the conformal conductive layer 174 and the ground plane can define a shielded volume or region. Such a configuration can be implemented to provide shielding functionality on one or more sides of the shielded package 160. Additional details concerning such shielding can be found in, for example, U.S. patent application Ser. No. 14/528,447 filed on Oct. 30, 2014, entitled DEVICES AND METHODS RELATED TO PACKAGING OF RADIO-FREQUENCY DEVICES ON CERAMIC SUBSTRATES, which is also expressly incorporated by reference in its entirety for all purposes. In some embodiments, the overmold 172 may not be present (e.g., the overmold 172 may be optional). For example, when the packaging substrate 162 is a ceramic substrate, the overmold 172 may not be present.

In the example of FIG. 5, an array of solder balls 106 is shown to be implemented on the underside of the packaging substrate 162 so as to define an underside volume. A lower component 104 is shown to be mounted within such an underside volume to thereby form a dual-sided package 100. An overmold 105 may be formed and/or implemented in the underside volume (where the lower component 104 is located) formed by the solder balls 106 (e.g., formed by a set of through-mold connections, such as a BGA). In one embodiment, the overmold 105 may encapsulate at least a portion of the lower component 104. For example, the overmold 105 may fully or partially encapsulate the lower component 104. In another embodiment, the overmold 105 may encapsulate at least a portion of the solder balls 106 (e.g., through-mold connections). For example, the overmold 105 may fully or partially encapsulate the solder balls 106. In FIG. 5, the dual-sided package 100 is shown to be mounted on a circuit board 110 such as a phone board. As discussed above, the overmold 105 and/or the solder balls 106 (e.g., the exposed portions of the solder balls 106) may form a land grid array (LGA) type/style package. As illustrated in FIG. 5, the solder balls 106 may have a semicircular shape. For example, the bottom portion of the solder balls 106 may be removed to form the semicircular shape. The semicircular shape of the solder balls 106 may be formed during a manufacturing process, as discussed in more detail below.

As illustrated in FIG. 5, the dual-sided package 100 may be attached to the circuit board 110 via connections 116. A close-up view of the solder balls 106 and the connections 116, and additional details (of the solder balls 106 and the connections 116) are illustrated/discussed above in conjunction with FIG. 2. Also as illustrated in FIG. 3, a gap 109 is present between the surface 112 and the surface 113 of the circuit board 110. The gap 109 may help protect the lower component 104 from damage when there are linear displacements of the dual-sided package 100 due to flexing or dropping, as discussed above. The gap 109 may also allow the dual-sided package to adapt to process/manufacturing variations when the dual-sided package 100 is installed on the circuit board 110, as discussed above.

In the examples of FIGS. 3-5, the solder balls 106 are depicted as being implemented in a single row that forms a perimeter at an underside of the shielded package. If such solder balls are utilized as input and/or output for processing of radio-frequency (RF) signals, it may be desirable to provide shielding between such input/output solder balls and locations outside of the dual-sided package 100. Furthermore, it shall be understood that in other embodiments, any of the shielding features of FIGS. 3, 4, and/or 5 may be combined. For example, two or more of the shielding wires 130 illustrated in FIG. 3, the component 150 illustrated in FIG. 4, and the conformal conductive layer 174 illustrated in FIG. 5, may be combined.

Figure 6A:
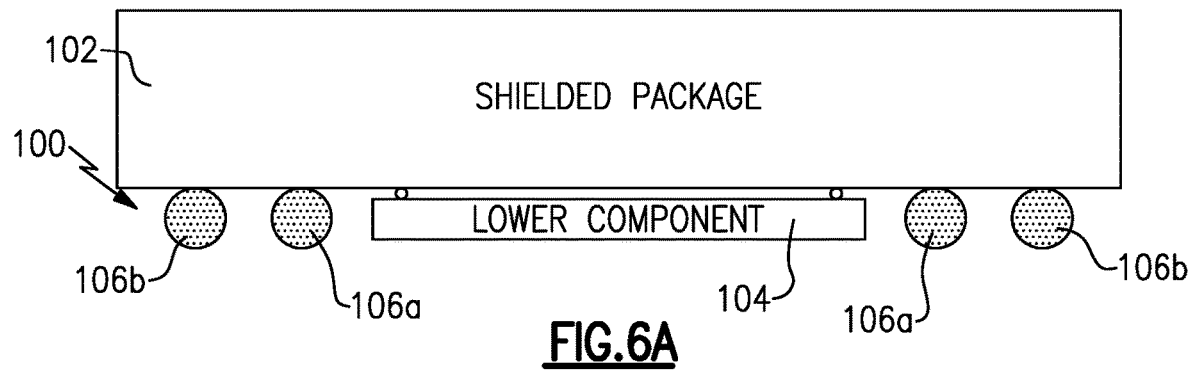
FIG. 6A illustrates a side view of a dual-sided package, according to some implementations.
Figure 6B:
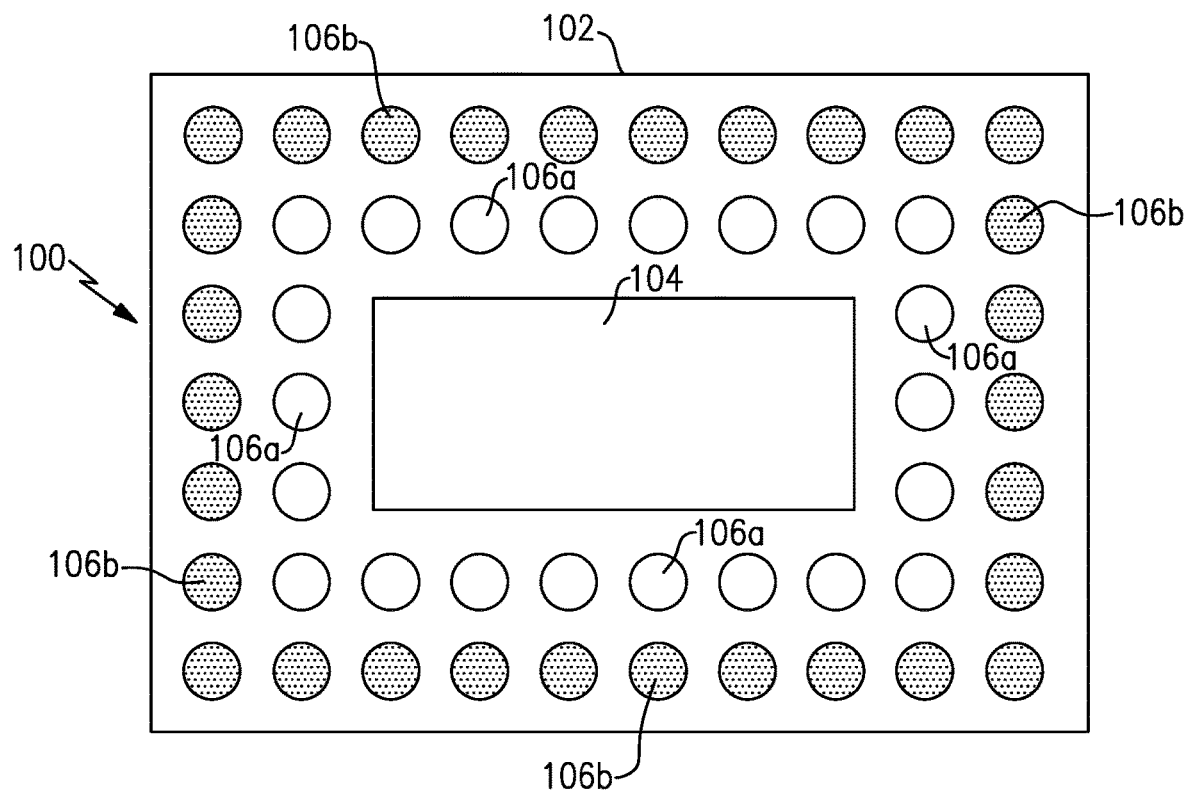
FIG. 6B illustrates an underside view of a dual-sided package, according to some implementations.

FIGS. 6A and 6B show side and underside views of a dual-sided package 100 configured to provide such shielding functionality. In the example of FIGS. 6A and 6B, two rows of solder balls can be implemented. The inner row of solder balls 106a can be utilized for input and/or output of RF signals, or for any other input/output where shielding is desired. The outer row of solder balls 106b can be utilized for, for example, grounding of the dual-sided package 100, and can be electrically connected to the ground plane of the shielded package 102. Accordingly, the outer row of solder balls 106b can provide shielding for the inner row of solder balls 106a. The outer row of solder balls 106b can also provide shielding for the lower component 104.

In the example of FIGS. 6A and 6B, each of the inner and outer rows of solder balls 106a, 106b is shown to form a full perimeter on the underside of the shielded package 102. However, it will be understood that either or both of the inner and outer rows of solder balls 106a, 106b can form partial perimeter(s) as needed or desired to achieve desired functionalities. For example, if shielding is desired on only one side, a full perimeter of the outer row of solder balls 106b may not be needed. Accordingly, one or more sides of outer row of solder balls 106b can be implemented to provide such shielding functionality. In another example, input/output connections (e.g., RF input/output, control signals, power) may not need a full perimeter of inner row of solder balls 106a. Accordingly, the inner row of solder balls 106a can form a partial perimeter on the underside of the shielded package 102. Furthermore, the examples of FIGS. 6A and 6B may illustrate views of the dual-sided package 100 before the overmold (e.g., overmold 105 illustrated in FIG. 2) is implemented and/or formed on the underside of the shielded package 102.

Figure 6C:
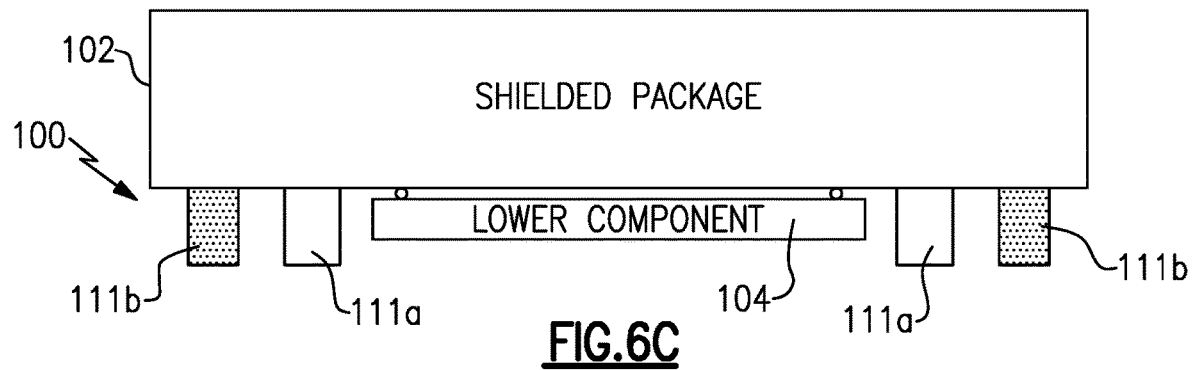
FIG. 6C illustrates a side view of a dual-sided package configured to provide shielding functionality, according to some implementations.
Figure 6D:
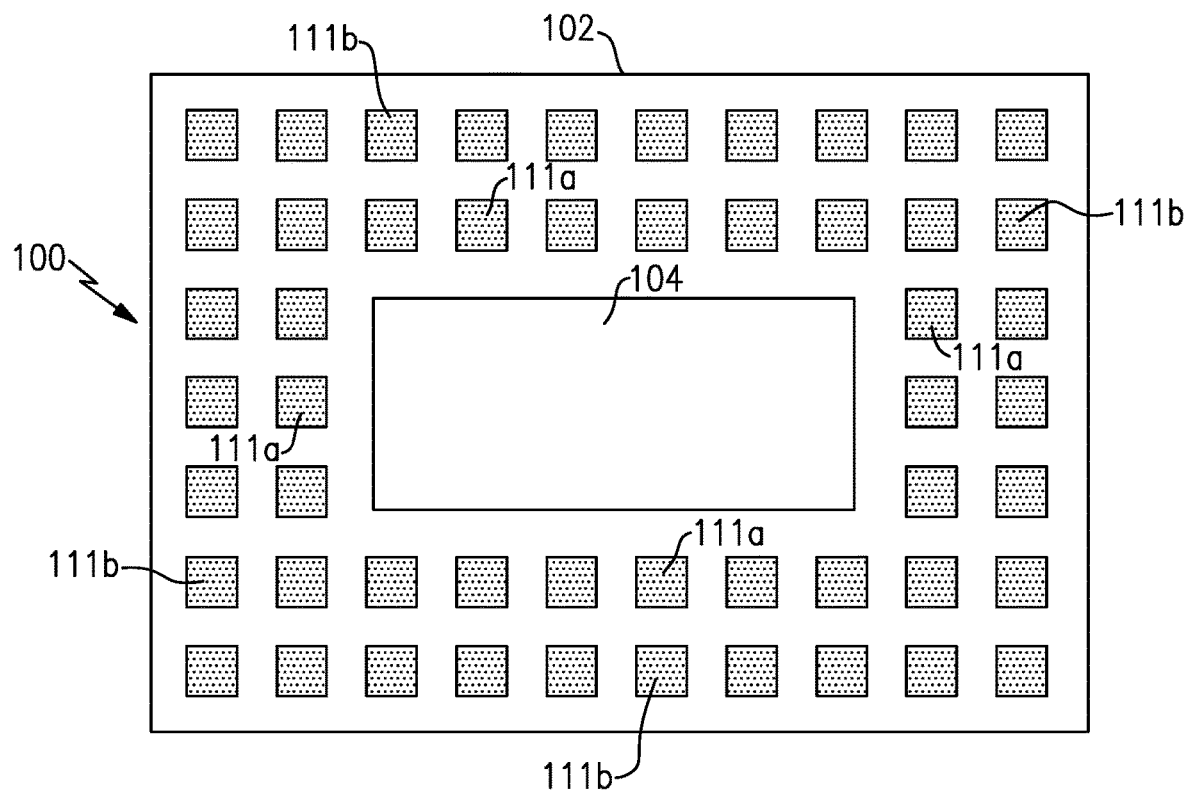
FIG. 6D illustrates an underside view of a dual-sided package configured to provide shielding functionality, according to some implementations.

FIGS. 6C and 6D show side and underside views of a dual-sided package 100 configured to provide such shielding functionality. In the example of FIGS. 6C and 6D, two rows of pillars (e.g., columns, posts, etc.) can be implemented.

The inner row of pillars 111a can be utilized for input and/or output of RF signals, or for any other input/output where shielding is desired. The outer row of pillars 111b can be utilized for, for example, grounding of the dual-sided package 100, and can be electrically connected to the ground plane of the shielded package 102. Accordingly, the outer row of pillars 111b can provide shielding for the inner row of pillars 111a. The outer row of pillars 111b can also provide shielding for the lower component 104.

In the example of FIGS. 6C and 6D, each of the inner and outer rows of pillars 111a, 111b is shown to form a full perimeter on the underside of the shielded package 102. However, it will be understood that either or both of the inner and outer rows of pillars 111a, 111b can form partial perimeter(s) as needed or desired to achieve desired functionalities. For example, if shielding is desired on only one side, a full perimeter of the outer row of pillars 111b may not be needed. Accordingly, one or more sides of outer row of pillars 111b can be implemented to provide such shielding functionality. In another example, input/output connections (e.g., RF input/output, control signals, power) may not need a full perimeter of inner row of pillars 111a. Accordingly, the inner row of pillars 111a can form a partial perimeter on the underside of the shielded package 102. Furthermore, the examples of FIGS. 6C and 6D may illustrate views of the dual-sided package 100 before the overmold (e.g., overmold 105 illustrated in FIG. 2) is implemented and/or formed on the underside of the shielded package 102.

Examples of Additional Features in Dual-Sided Packages

FIG. 7A illustrates a dual-sided package 100 that is similar to the BGA-based example of FIG. 2. An overmold 105 may be formed and/or implemented in the underside volume (where the lower component 104 is located) formed by the solder balls (e.g., formed by a set of through-mold connections, such as a BGA). In one embodiment, the overmold 105 may encapsulate at least a portion of the lower component 104. For example, the overmold 105 may fully or partially encapsulate the lower component 104. In another embodiment, the overmold 105 may encapsulate at least a portion of the solder balls (e.g., through-mold connections). For example, the overmold 105 may fully or partially encapsulate the solder balls. As discussed above, the overmold 105 and/or the solder balls 106 (e.g., the exposed portions of the solder balls 106) may form a land grid array (LGA) type/style package. As illustrated in FIG. 7A, the solder balls 106 may have a semicircular shape. For example, the bottom portion (e.g., bottom half) of the solder balls 106 may be removed to form the semicircular shape. The semicircular shape of the solder balls 106 may be formed during a manufacturing process, as discussed in more detail below. In one embodiment, exposing a portion of the solder balls 106 through the overmold 105 may allow the solder balls 106 to provide a connection (e.g., a through-mold connection, an electrical connection) to components of the dual-sided package 100. A close-up view of the solder balls 106 and additional details (of the solder balls 106) are illustrated/discussed above in conjunction with FIG. 2.

FIG. 7B illustrates a pillar-based example of a dual-sided package 100. An overmold 105 may be formed and/or implemented in the underside volume (where the lower component 104 is located) formed by the pillars 111 (e.g., through-mold connections). In one embodiment, the overmold 105 may encapsulate at least a portion of the lower component 104. For example, the overmold 105 may fully or partially encapsulate the lower component 104. In another embodiment, the overmold 105 may encapsulate at least a portion of the pillars 111. Portions of the pillars 111 (e.g., the upper surfaces of the pillars 111) may be exposed through the overmold 105. As discussed above, the overmold 105 and/or the pillars 111 may form a land grid array (LGA) type/style package. In one embodiment, exposing a portion of the pillars 111 through the overmold 105 may allow the pillars 111 to provide a connection (e.g., a through-mold connection, an electrical connection) to components of the dual-sided package 100.

FIG. 8A shows that in some embodiments, a dual-sided package can include a plurality of lower components. In FIG. 8A, a dual-sided package 100 is similar to the BGA-based example of FIG. 2. The dual-sided package 100 is shown to include two lower components 104a, 104b mounted to the underside of a shielded package 102. An overmold 105 may be formed and/or implemented in the underside volume (where the lower components 104a and 104b are located) formed by the solder balls (e.g., formed by a set of through-mold connections, such as a BGA). In one embodiment, the overmold 105 may encapsulate at least a portion of the lower component 104. For example, the overmold 105 may fully or partially encapsulate the lower component 104. In another embodiment, the overmold 105 may encapsulate at least a portion of the solder balls (e.g., through-mold connections). For example, the overmold 105 may fully or partially encapsulate the solder balls. As discussed above, the overmold 105 and/or the solder balls 106 (e.g., the exposed portions of the solder balls 106) may form a land grid array (LGA) type/style package. As illustrated in FIG. 8A, the solder balls 106 may have a semicircular shape. For example, the bottom portion of the solder balls 106 may be removed to form the semicircular shape. The semicircular shape of the solder balls 106 may be formed during a manufacturing process, as discussed in more detail below. In one embodiment, exposing a portion of the solder balls 106 through the overmold 105 may allow the solder balls 106 to provide a connection (e.g., a through-mold connection, an electrical connection) to components of the dual-sided package 100. A close-up view of the solder balls 106 and additional details (of the solder balls 106) are illustrated/discussed above in conjunction with FIG. 2.

FIG. 8B shows that in some embodiments, a dual-sided package can include a plurality of lower components. In FIG. 8B, the dual-sided package 100 may be a pillar-based example. The dual-sided package 100 is shown to include two lower components 104a, 104b mounted to the underside of a shielded package 102. An overmold 105 may be formed and/or implemented in the underside volume (where the lower components 104a and 104b are located) formed by the pillars 111 (e.g., through-mold connections). In one embodiment, the overmold 105 may encapsulate at least a portion of the lower component 104. For example, the overmold 105 may fully or partially encapsulate the lower component 104. In another embodiment, the overmold 105 may encapsulate at least a portion of the solder balls. Portions of the pillars 111 (e.g., the upper surfaces of the pillars 111) may be exposed through the overmold 105. As discussed above, the overmold 105 and/or the pillars 111 may form a land grid array (LGA) type/style package. In one embodiment, exposing a portion of the pillars 111 through the overmold 105 may allow the pillars 111 to provide a connection (e.g., a through-mold connection, an electrical connection) to components of the dual-sided package.

Other additional features, variations, or any combination thereof, can be also be implemented.

Examples Related to Fabrication of Dual-Sided Packages

FIGS. 9-14 show examples of how dual-sided packages can be fabricated. As described herein, such examples can facilitate mass-production of dual-sided packages.

FIGS. 9-13 show various stages of a fabrication process in which substantially all of dual-sided features can be implemented in a panel format having an array of to-be-separated units, before such units are separated (also referred to as singulated). Although described in the context of BGA-based and/or pillar (e.g., column, posts, etc.) based dual-sided packages, it will be understood that one or more features of the fabrication technique of FIGS. 9-13 can also be implemented for fabrication of dual-sided packages having other types of mounting features. In some implementations, the fabrication processes of FIGS. 9-14 can be utilized for manufacturing of dual-sided packages described herein in reference to, for example, FIGS. 3, 4, 5, 7A, 7B, 8A, 8B, 15, 16, and/or 17.

Referring to FIG. 9A, a fabrication state 250a can include a panel 252 having a plurality of to-be-singulated units. For example, singulation can occur at boundaries depicted by dashed lines 260 so at to yield singulated individual units. The panel 252 is shown to include a substrate panel 254 on which upper portions (collectively indicated as 256) are formed. Each unit of such an upper-portion panel can include various parts described herein in reference to FIGS. 3, 4, and/or 5. For example, each unit of such an upper-portion panel may include shielding features of FIGS. 3, 4, and/or 5. Such parts can include various components and shielding structures mounted or implemented on the substrate panel 254. The upper-portion panel 256 can also include an overmold layer which can be formed as a common layer for a number of individual units. Similar to the common overmold layer, an upper conductive layer 258 can be formed to cover a number of individual units.

Referring to FIG. 9B, a fabrication state 262a can include the panel 252 of FIG. 9A being inverted so that its underside faces upward. Such an inverted orientation can allow processing of the underside while the individual units are still attached in the panel.

Referring to FIG. 9C, a fabrication state 263a can include a lower component 104 being attached for each unit on the underside (which is facing upward) of the substrate 254. The fabrication state 263a may also include an array of solder balls 106 being formed for each unit on the underside (which is facing upward) of the substrate 254. Such a step is shown to yield an array of dual-sided units to be singulated. It will be understood that the lower component 104 may be attached for each unit (on the underside) after the array of solder balls 106 is formed, or vice versa. It shall also be understood that the lower component (for each unit on the underside) and the array of solder balls 106 may be attached, implemented, and/or formed substantially simultaneously.

Referring to FIG. 9D, a fabrication state 264a can include implementing and/or forming overmold 105 on the underside (which is facing upward) of the substrate 254. In one embodiment, the overmold 105 may completely encapsulate the lower component 104 and the solder balls 106 (e.g., the through-mold connections) in the fabrication state 264a.

Referring to FIG. 9E, a fabrication state 266a can include removing at least a portion of the overmold 105. For example, an outward surface (e.g., the upper surface) of the overmold 105 may be removed. Removing at least the portion of the overmold 105 may expose the solders balls 106 through the overmold 105. For example, the overmold 105 may partially encapsulate the solder balls 106 after the portion of the overmold 105 is removed. The portion of the overmold 105 may be removed using various different types of processes and/or methods. For example, the overmold 105 may be ground (with an abrasive surface) to remove the portion of the overmold 105 (to expose a portion of the solder balls 106). In another example, the portion of the overmold 105 may be removed using a laser to melt and/or burn the portion of the overmold 105 (to expose a portion of the solder balls 106). In a further example, the portion of the overmold 105 may be ablated. For example, a stream of particles (e.g., water particles, sand particles, etc.) may be used to erode the portion of the overmold 105. In one embodiment, removing the portion of the overmold 105 may also remove a portion of the solder balls 106. For example, ablating the overmold 105 may remove the top portions of the solder balls 106 to form the semicircular shape illustrated in FIGS. 9E and 9F. This may also expose a portion of the solder balls 106 through the overmold 105 and may allow the solder balls 106 to provide a connection (e.g., an electrical connection) through the overmold 105.

Referring to FIG. 9F, a fabrication state 268a can include individual units being singulated to yield a plurality of dual-sided packages 100 substantially ready to be mounted to circuit boards. It will be understood that such a singulation process can be achieved while the panel (252) is in its inverted orientation (as shown in the example of FIG. 9E), or while the panel (252) is in its upright orientation (e.g., as in the example of FIG. 9A). A close-up view of the solder balls 106 and additional details (of the solder balls 106) are illustrated/discussed above in conjunction with FIG. 2.

Referring to FIG. 9G, a fabrication state 250b can include a panel 252 having a plurality of to-be-singulated units. For example, singulation can occur at boundaries depicted by dashed lines 260 so at to yield singulated individual units. The panel 252 is shown to include a substrate panel 254 on which upper portions (collectively indicated as 256) are formed. Each unit of such an upper-portion panel can include various parts described herein in reference to FIGS. 3, 4, and/or 5. For example, each unit of such an upper-portion panel may include shielding features of FIGS. 3, 4, and/or 5. Such parts can include various components and shielding structures mounted or implemented on the substrate panel 254. The upper-portion panel 256 can also include an overmold layer which can be formed as a common layer for a number of individual units. Similar to the common overmold layer, an upper conductive layer 258 can be formed to cover a number of individual units.

Referring to FIG. 9H, a fabrication state 262b can include the panel 252 of FIG. 9A being inverted so that its underside faces upward. Such an inverted orientation can allow processing of the underside while the individual units are still attached in the panel.

Referring to FIG. 9I, a fabrication state 263b can include a lower component 104 being attached for each unit on the underside (which is facing upward) of the substrate 254. The fabrication state 263b may also include an array of pillars 111 being formed for each unit on the underside (which is facing upward) of the substrate 254. Such a step is shown to yield an array of dual-sided units to be singulated. It will be understood that the lower component 104 may be attached for each unit (on the underside) after the array of pillars 111 are formed, or vice versa. It shall also be understood that the lower component (for each unit on the underside) and the array of pillars 111 may be attached, implemented, and/or formed substantially simultaneously. The pillars 111 may be formed using various methods, processes, technologies, etc., such as copper pillar bumping.

Referring to FIG. 9J, a fabrication state 264*b* can include implementing and/or forming overmold 105 on the underside (which is facing upward) of the substrate 254. In one embodiment, the overmold 105 may completely encapsulate the lower component 104 and the pillars 111 (e.g., the through-mold connections) in the fabrication state 264*b*.

Referring to FIG. 9K, a fabrication state 266*b* can include removing at least a portion of the overmold 105. For example, an outward surface (e.g., the upper surface) of the overmold 105 may be removed. Removing at least the portion of the overmold 105 may expose the solders balls 106 through the overmold 105. For example, the overmold 105 may partially encapsulate the solder balls 106 after the portion of the overmold 105 is removed. The portion of the overmold 105 may be removed using various different types of processes and/or methods. For example, the overmold 105 may be ground (with an abrasive surface) to remove the portion of the overmold 105 (to expose a portion of the solder balls 106). In another example, the portion of the overmold 105 may be removed using a laser to melt and/or burn the portion of the overmold 105 (to expose a portion of the solder balls 106). In a further example, the portion of the overmold 105 may be ablated. For example, a stream of particles (e.g., water particles, sand particles, etc.) may be used to erode the portion of the overmold 105. In one embodiment, removing the portion of the overmold 105 may also remove a portion of the pillars 111. For example, ablating the overmold 105 may remove the top portions of the pillars 111. This may also expose a portion of the pillars 111 through the overmold 105 and may allow the pillars 111 to provide a connection (e.g., an electrical connection) through the overmold 105.

Referring to FIG. 9L, a fabrication state 268*b* can include individual units being singulated to yield a plurality of dual-sided packages 100 substantially ready to be mounted to circuit boards. It will be understood that such a singulation process can be achieved while the panel (252) is in its inverted orientation (as shown in the example of FIG. 9K), or while the panel (252) is in its upright orientation (e.g., as in the example of FIG. 9G).

As described herein, such processing of most or all of upper and lower sides of a substrate panel can be achieved since the side walls of the dual-sided packages are not utilized for shielding. However, when one or more side walls include shielding features, at least some of processing related to shielding need to be implemented with the corresponding side walls exposed. In some embodiments (e.g., where all four side walls include shielding features), at least some processing need to be performed on singulated units.
Examples Related to Processing of Individual Units In the examples described in reference to FIGS. 9A-9L, FIGS. 10-10L, FIGS. 11A-11M, FIGS. 12A-12F, and FIGS. 13A-13C, substantially all steps in fabrication of dual-sided packages can be performed in a panel format before individual units are singulated. For the examples of FIGS. 14A-14D, the forming of the conductive layer on each unit may be performed after a singulation step/process.

FIGS. 10-10L, FIGS. 11A-11M, FIGS. 12A-12F, FIGS. 13A-13C and FIGS. 14A-14D show examples related a process for manufacturing conformal-shielded dual-sided packages. In such a process, singulation can be performed after process steps (e.g., mounting of a lower component and formation of a BGA) are performed on the underside of a packaging substrate. More particularly, FIGS. 10-10L, FIGS. 11A-11M, FIGS. 12A-12F, and FIGS. 13A-13C show various example states leading to formation of dual-sided packages without conformal shielding. FIGS. 14A-14D show examples related to how conformal shielding can be formed for such dual-sided packages.

Figure 10A:
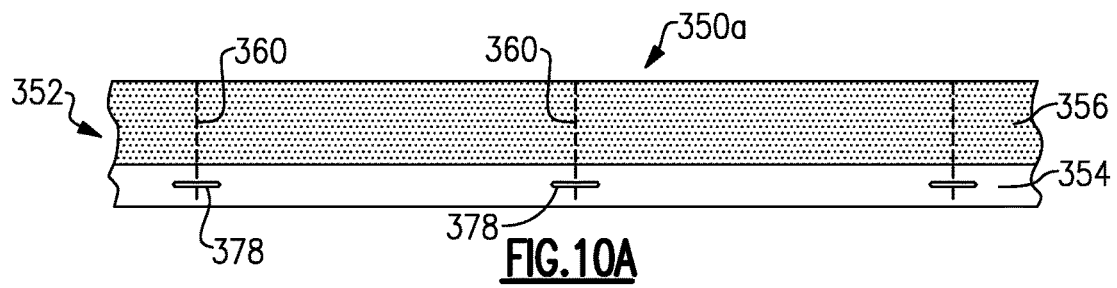
FIGS. 10A-10L illustrate various stages of fabrication processes for implementing dual-sided packages, according to some implementations.

In some embodiments, the examples process steps of FIGS. 10A-10F can be similar to the examples of FIGS. 9A-9F, but without the conductive layer (258). Referring to FIG. 10A, a fabrication state 350*a* can include a panel 352 having a plurality of to-be-singulated units. For example, singulation can occur at boundaries depicted by dashed lines 360 so at to yield singulated individual units. The panel 352 is shown to include a substrate panel 354 on which upper portions (collectively indicated as 356) are formed. Each unit of such an upper-portion panel can include various parts described herein in reference to any combination of FIGS. 3, 4, and 5. Such parts can include various components and shielding structures mounted or implemented on the substrate panel 354. The upper-portion panel 356 can also include an overmold layer which can be formed as a common layer for a number of individual units. In the example of FIG. 10A, conductive features 378 are shown to be implemented within the substrate panel 354. Each conductive feature 378 can straddle the corresponding boundary 360, such than when separation occurs at the boundary 360, each of the two exposed side walls of the substrates includes an exposed portion of the conductive feature 378 that has been cut. Each of such cut conductive feature is electrically connected to a ground plane (not shown) within the corresponding substrate.

Figure 10B:
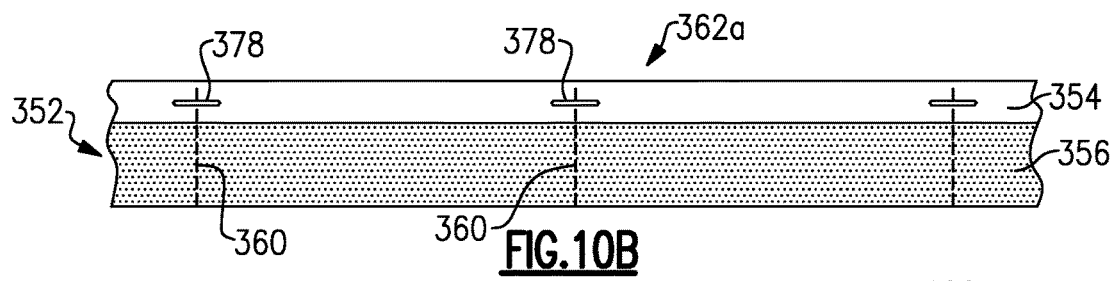

Referring to FIG. 10B, a fabrication state 362*a* can include the panel 352 of FIG. 10A being inverted so that its underside faces upward. Such an inverted orientation can allow processing of the underside while the individual units are still attached in the panel.

Figure 10C:
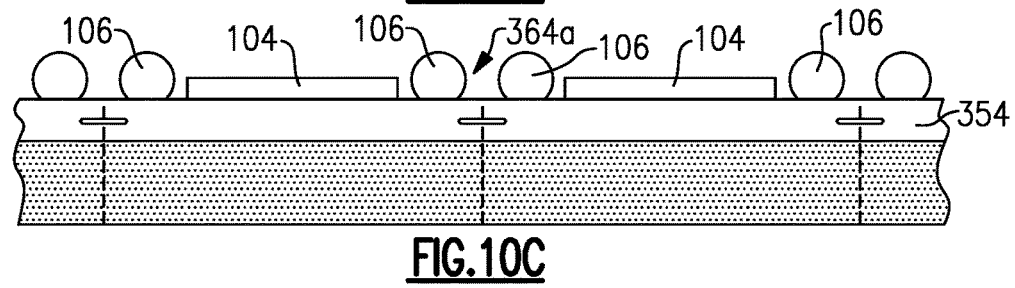

Referring to FIG. 10C, a fabrication state 364*a* can include a lower component 104 being attached for each unit on the underside (which is facing upward) of the substrate 354. Fabrication state 364*a* can also include an array of solder balls 106 being formed for each unit on the underside (which is facing upward) of the substrate 354. It shall be understood that the lower component 104 may be attached for each unit (on the underside) after the array of solder balls 106 is formed, or vice versa. It shall also be understood that the lower component 104 (for each unit on the underside) and the array of solder balls 106 may be attached, implemented, and/or formed substantially simultaneously.

Figure 10D:
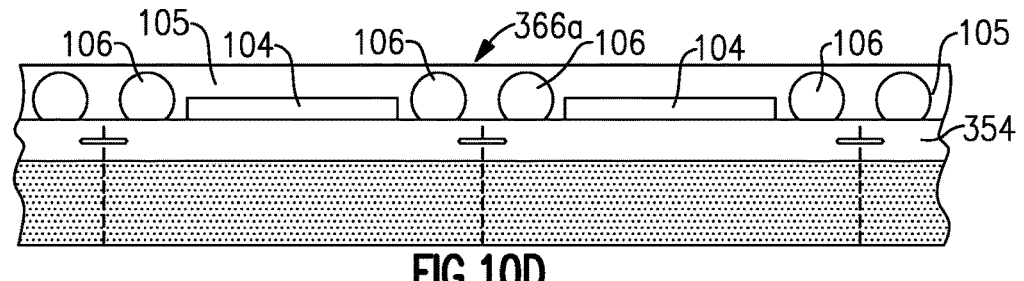

Referring to FIG. 10D, a fabrication state 366*a* can include implementing an overmold 105 over the array of solder balls 106 and the lower components 104. In one embodiment, the overmold 105 may completely encapsulate the lower component 104 and the solder balls 106 (e.g., the through-mold connections) in the fabrication state 366*a*.

Figure 10E:
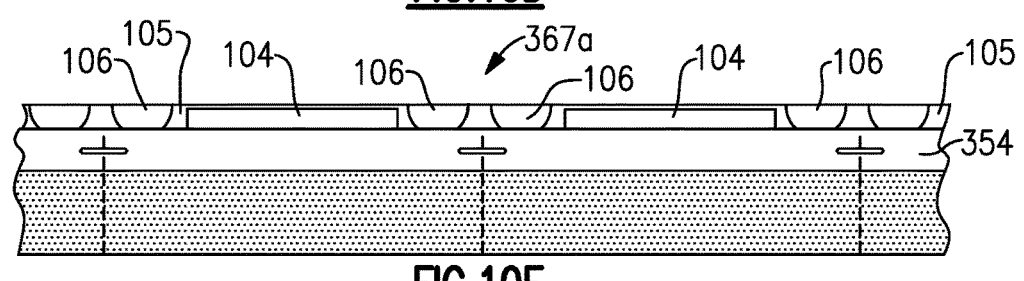

Referring to FIG. 10E, a fabrication state 367*a* can include removing at least a portion of the overmold 105. For example, an outward surface (e.g., the upper surface) of the overmold 105 may be removed. Removing at least the portion of the overmold 105 may expose the solders balls 106 through the overmold 105. For example, the overmold 105 may partially encapsulate the solder balls 106 after the portion of the overmold 105 is removed. The portion of the overmold 105 may be removed using various different types of processes and/or methods. For example, the overmold 105 may be ground (with an abrasive surface) to remove the portion of the overmold 105 (to expose a portion of the solder balls 106). In another example, the portion of the overmold 105 may be removed using a laser to melt and/or burn the portion of the overmold 105 (to expose a portion of the solder balls 106). In a further example, the portion of the overmold 105 may be ablated. For example, a stream of particles (e.g., water particles, sand particles, etc.) may be used to erode the portion of the overmold 105. Such a step is shown to yield an array of un-shielded dual-sided units to be singulated. In one embodiment, removing the portion of the overmold 105 may also remove a portion of the solder balls 106. For example, ablating the overmold 105 may remove the top portions of the solder balls 106 to form the semicircular shape illustrated in FIGS. 10E and 10F. This may also expose a portion of the solder balls 106 through the overmold 105 and may allow the solder balls 106 to provide a connection (e.g., an electrical connection) through the overmold 105.

Figure 10F:
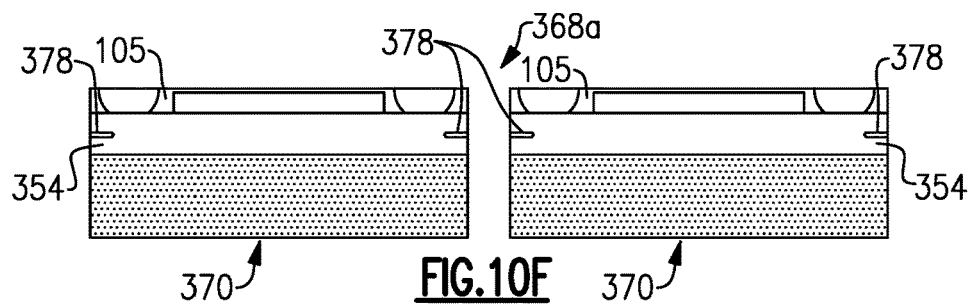

Referring to FIG. 10F, a fabrication state 368a can include individual units being singulated to yield a plurality of un-shielded dual-sided packages 370 substantially ready for conformal shielding process steps, or if shielding is not needed, substantially ready to be mounted to circuit boards. As described above, each of the dual-sided packages 370 includes side walls; and each side wall is shown to include an exposed portion of the cut conductive feature 378. In some embodiments, such a singulation process can be achieved while the panel (352) is in its inverted orientation (as shown in the example of FIG. 10E), or while the panel (352) is in its upright orientation (e.g., as in the example of FIG. 10A). A close-up view of the solder balls 106 and additional details (of the solder balls 106) are illustrated/discussed above in conjunction with FIG. 2.

Figure 10G:
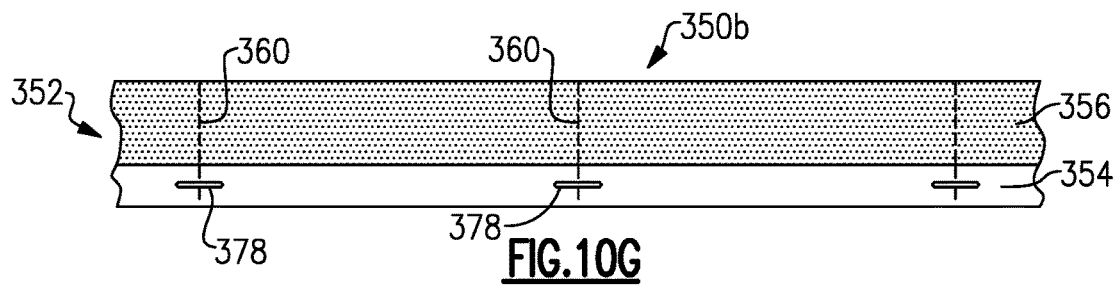

In some embodiments, the examples process steps of FIGS. 10G-10L can be similar to the examples of FIGS. 9G-9L, but without the conductive layer (258). Referring to FIG. 10G, a fabrication state 350b can include a panel 352 having a plurality of to-be-singulated units. For example, singulation can occur at boundaries depicted by dashed lines 360 so at to yield singulated individual units. The panel 352 is shown to include a substrate panel 354 on which upper portions (collectively indicated as 356) are formed. Each unit of such an upper-portion panel can include various parts described herein in reference to any combination of FIGS. 3, 4, and 5. Such parts can include various components and shielding structures mounted or implemented on the substrate panel 354. The upper-portion panel 356 can also include an overmold layer which can be formed as a common layer for a number of individual units. In the example of FIG. 10G, conductive features 378 are shown to be implemented within the substrate panel 354. Each conductive feature 378 can straddle the corresponding boundary 360, such than when separation occurs at the boundary 360, each of the two exposed side walls of the substrates includes an exposed portion of the conductive feature 378 that has been cut. Each of such cut conductive feature is electrically connected to a ground plane (not shown) within the corresponding substrate.

Figure 10H:
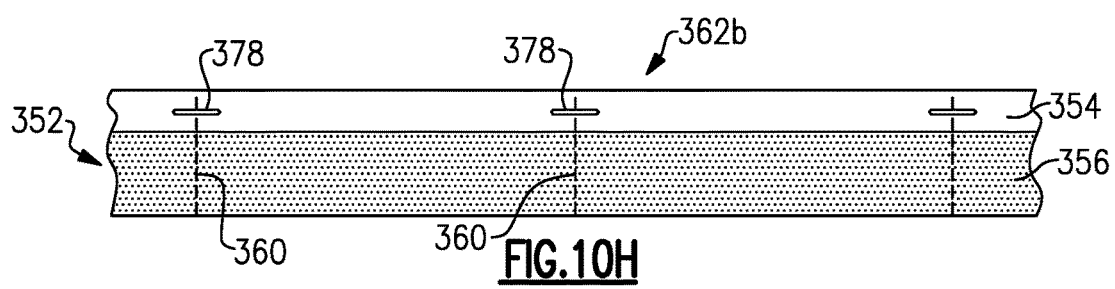

Referring to FIG. 10H, a fabrication state 362b can include the panel 352 of FIG. 10G being inverted so that its underside faces upward. Such an inverted orientation can allow processing of the underside while the individual units are still attached in the panel.

Figure 10I:
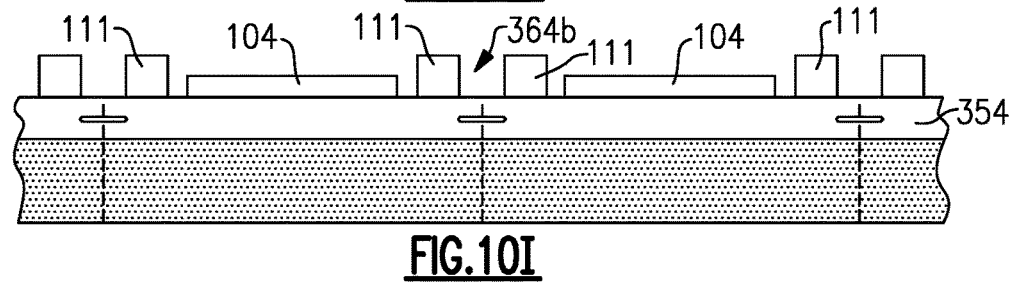

Referring to FIG. 10I, a fabrication state 364b can include a lower component 104 being attached for each unit on the underside (which is facing upward) of the substrate 354. Fabrication state 364b can also include an array of pillars 111 being formed for each unit on the underside (which is facing upward) of the substrate 354. It shall be understood that the lower component 104 may be attached for each unit (on the underside) after the array of pillars 111 is formed, or vice versa. It shall also be understood that the lower component 104 (for each unit on the underside) and the array of pillars 111 may be attached, implemented, and/or formed substantially simultaneously.

Figure 10J:
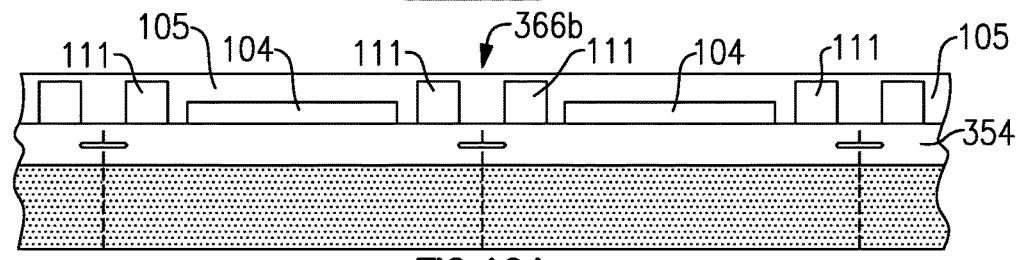

Referring to FIG. 10J, a fabrication state 366b can include implementing an overmold 105 over the array of pillars 111 and the lower components 104. In one embodiment, the overmold 105 may completely encapsulate the lower component 104 and the pillars 111 (e.g., the through-mold connections) in the fabrication state 366b.

Figure 10K:
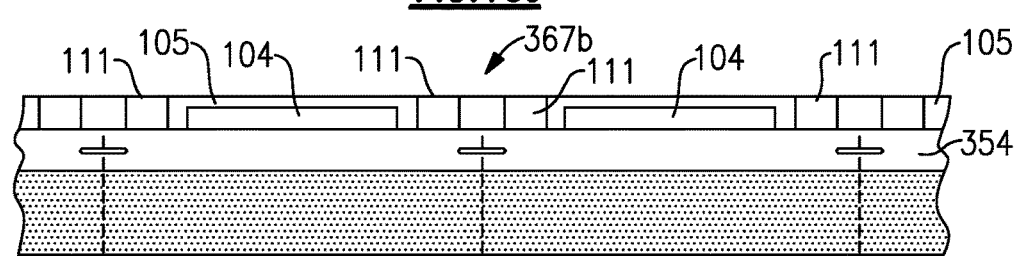

Referring to FIG. 10K, a fabrication state 367b can include removing at least a portion of the overmold 105. For example, an outward surface (e.g., the upper surface) of the overmold 105 may be removed. Removing at least the portion of the overmold 105 may expose the pillars 111 through the overmold 105. For example, the overmold 105 may partially encapsulate the pillars 111 after the portion of the overmold 105 is removed. The portion of the overmold 105 may be removed using various different types of processes and/or methods. For example, the overmold 105 may be ground (with an abrasive surface) to remove the portion of the overmold 105 (to expose a portion of the pillars 111). In another example, the portion of the overmold 105 may be removed using a laser to melt and/or burn the portion of the overmold 105 (to expose a portion of the pillars 111). In a further example, the portion of the overmold 105 may be ablated. For example, a stream of particles (e.g., water particles, sand particles, etc.) may be used to erode the portion of the overmold 105. Such a step is shown to yield an array of un-shielded dual-sided units to be singulated. In one embodiment, removing the portion of the overmold 105 may also remove a portion of the pillars 111. For example, ablating the overmold 105 may remove the top portions of the pillars 111. This may also expose a portion of the pillars 111 through the overmold 105 and may allow the pillars 111 to provide a connection (e.g., an electrical connection) through the overmold 105.

Figure 10L:
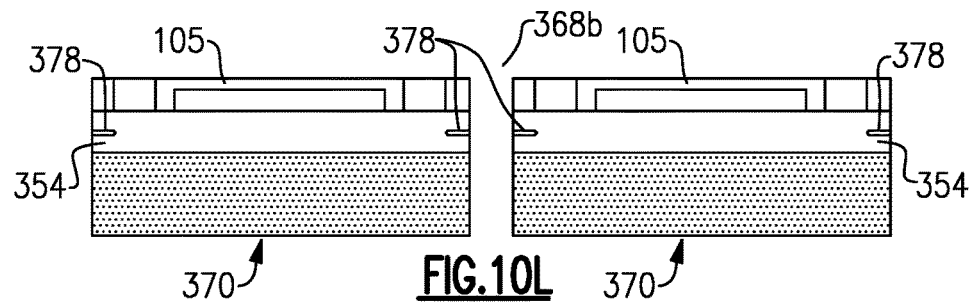

Referring to FIG. 10L, a fabrication state 368a can include individual units being singulated to yield a plurality of un-shielded dual-sided packages 370 substantially ready for conformal shielding process steps, or if shielding is not needed, substantially ready to be mounted to circuit boards. As described above, each of the dual-sided packages 370 includes side walls; and each side wall is shown to include an exposed portion of the cut conductive feature 378. In some embodiments, such a singulation process can be achieved while the panel (352) is in its inverted orientation (as shown in the example of FIG. 10K), or while the panel (352) is in its upright orientation (e.g., as in the example of FIG. 10G).

Figure 11A:
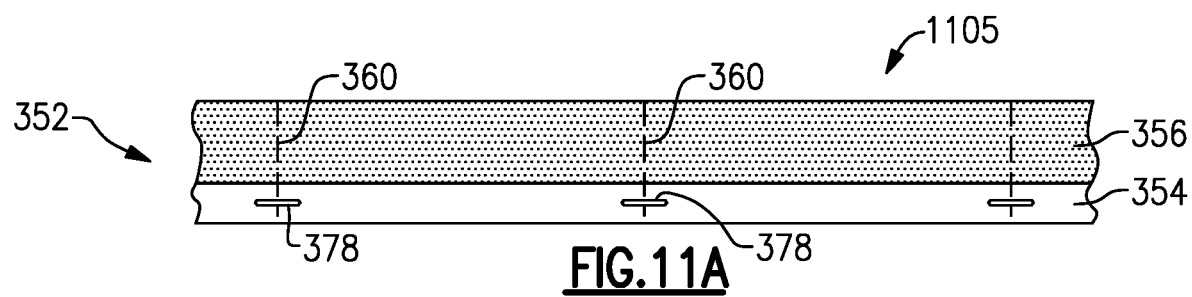
FIGS. 11A-11M illustrate various stages of fabrication processes for implementing dual-sided packages, according to some implementations.

FIGS. 11A-11G show various example states leading to formation of dual-sided packages without conformal shielding. Referring to FIG. 11A, a fabrication state 1105 can include a panel 352 having a plurality of to-be-singulated units. For example, singulation can occur at boundaries depicted by dashed lines 360 so at to yield singulated individual units. The panel 352 is shown to include a substrate panel 354 on which upper portions (collectively indicated as 356) are formed. Each unit of such an upper-portion panel can include various parts described herein in reference to any combination of FIGS. 3, 4, and 5. Such parts can include various components and shielding structures mounted or implemented on the substrate panel 354. The upper-portion panel 356 can also include an overmold layer which can be formed as a common layer for a number of individual units. In the example of FIG. 11A, conductive features 378 are shown to be implemented within the substrate panel 354. Each conductive feature 378 can straddle the corresponding boundary 360, such than when separation occurs at the boundary 360, each of the two exposed side walls of the substrates includes an exposed portion of the conductive feature 378 that has been cut. Each of such cut conductive feature is electrically connected to a ground plane (not shown) within the corresponding substrate.

Figure 11B:
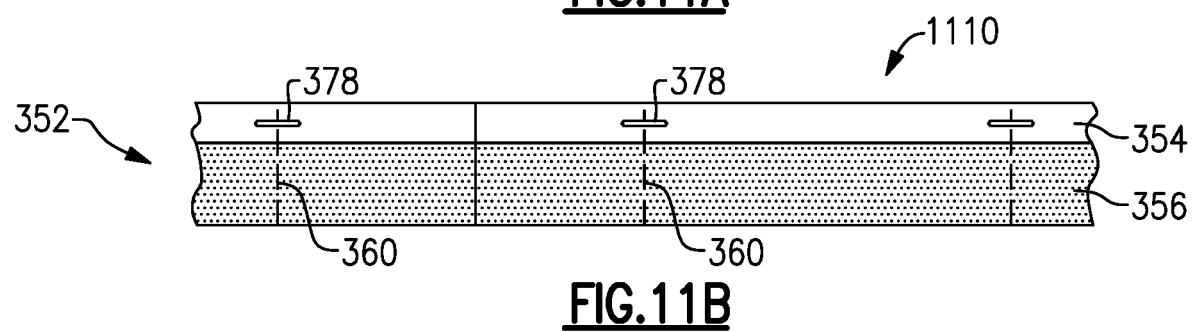

Referring to FIG. 11B, a fabrication state 1110 can include the panel 352 of FIG. 11A being inverted so that its underside faces upward. Such an inverted orientation can allow processing of the underside while the individual units are still attached in the panel.

Figure 11C:
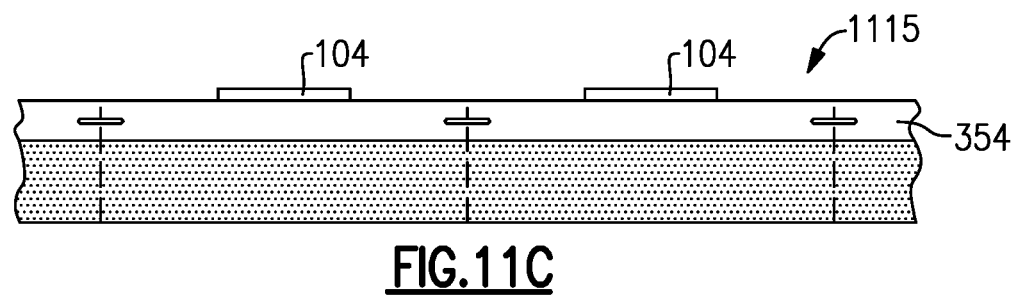

Referring to FIG. 11C, a fabrication state 1115 can include a lower component 104 being attached for each unit on the underside (which is facing upward) of the substrate 354. For example, the lower component 104 may be mounted, installed, etc., to the underside of the substrate 354. The lower component 104 may be directly attached to the substrate or may be attached to other components (e.g., one or more metal pads) on the substrate 354.

Figure 11D:
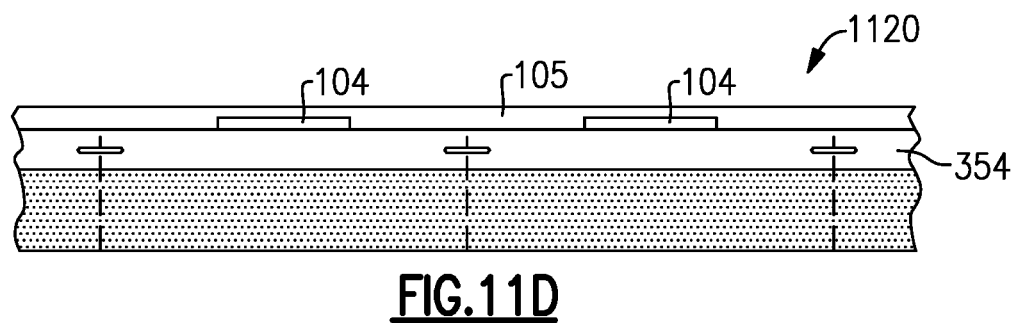

Referring to FIG. 11D, a fabrication state 1120 can include implementing an overmold 105 over the lower components 104. In one embodiment, the overmold 105 may completely encapsulate the lower component 104 in the fabrication state 1120.

Figure 11E:
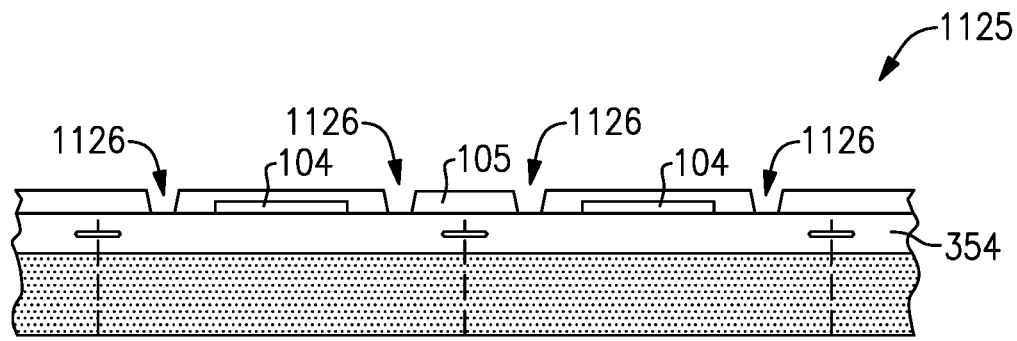

Referring to FIG. 11E, a fabrication state 1125 can include forming a plurality of cavities 1126 (e.g., holes, voids, spaces, gaps, etc.) in the overmold 105. The cavities 1126 may have a partial conical shape (e.g., a cone shape with the top and bottom portions of the cone removed). As illustrated in FIG. 11E, the cavities 1126 may have a trapezoidal shape when viewed from the side (e.g., a profile view). One having ordinary skill in the art understands that the cavities 1126 may have various sizes and/or shapes. For example, the cavities 1126 may be cylinder shaped, cubed shaped, trapezoid prism shaped, etc. In one embodiment, the cavities 1126 may be forming using a laser (e.g., a laser drill). For example, a laser may be used to burn and/or melt portions of the overmold 105 to form the cavities 1126. One having ordinary skill in the art understands that various other methods, processes, and/or operations may be used to form the cavities 1126.

Figure 11F:
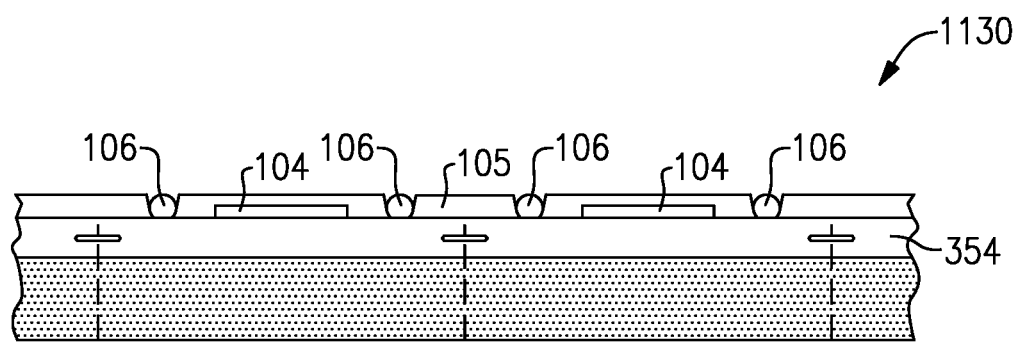

Referring to FIG. 11F, a fabrication state 1130 can include forming a plurality of solder balls 106 (e.g., through-mold connections) within the cavities 1126. For example, solder material (e.g., a conductive material that may melt at a certain temperature) may be deposited into the cavities 1126. In one embodiment, the height of the solder balls 106 may be lower than the height of the overmold 105. In another embodiment, the height of the solder balls may be equal (or substantially equal) to the height of the overmold 105. In another embodiment, the height of the solder may be higher than the height of the overmold 105. As illustrated in FIG. 11F, there may be a gap between the overmold 105 and the top of the solder balls 106. For example, the angle of the sides of the cavities 1126 (e.g., the side walls of the cavities 1126) may result in the gap between the overmold 105 and the top of the solder balls 106. This may be due to the shape/size of the cavities 1126 and the shape/size of the solder balls 106. In other embodiments, the gap between the overmold 105 and the top of the solder balls 106 may be larger, smaller, or may not be present, based on the shape/size of the cavities 1126 and the shape/size of the solder balls 106.

Figure 11G:
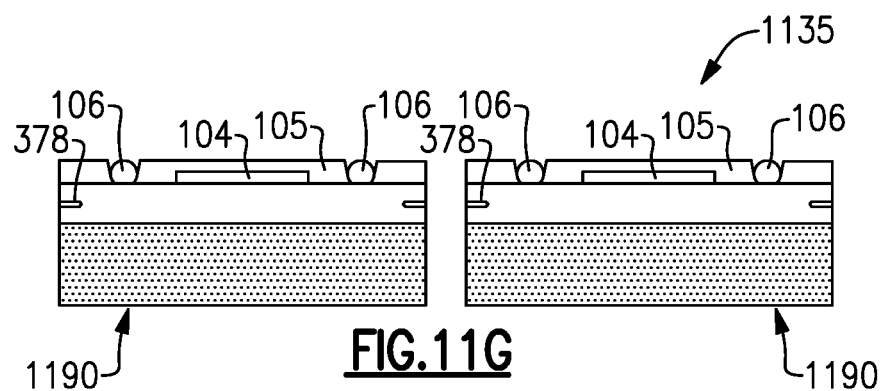

Referring to FIG. 11G, a fabrication state 1135 can include individual units being singulated to yield a plurality of un-shielded dual-sided packages 1190 substantially ready for conformal shielding process steps, or if shielding is not needed, substantially ready to be mounted to circuit boards. As described above, each of the dual-sided packages 1190 includes side walls; and each side wall is shown to include an exposed portion of the cut conductive feature 378. In some embodiments, such a singulation process can be achieved while the panel (352) is in its inverted orientation (as shown in the example of FIG. 11F), or while the panel (352) is in its upright orientation (e.g., as in the example of FIG. 11A). A close-up view of the solder balls 106 and additional details (of the solder balls 106) are illustrated/discussed above in conjunction with FIG. 2.

Figure 11H:
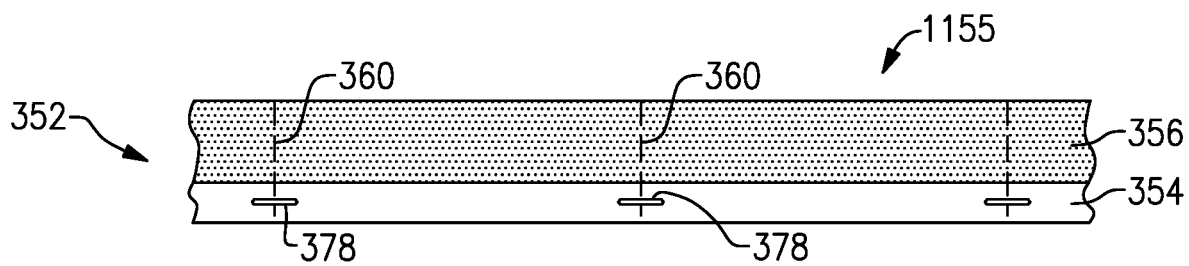

FIGS. 11H-11M show various example states leading to formation of dual-sided packages without conformal shielding. Referring to FIG. 11H, a fabrication state 1155 can include a panel 352 having a plurality of to-be-singulated units. For example, singulation can occur at boundaries depicted by dashed lines 360 so at to yield singulated individual units. The panel 352 is shown to include a substrate panel 354 on which upper portions (collectively indicated as 356) are formed. Each unit of such an upper-portion panel can include various parts described herein in reference to any combination of FIGS. 3, 4, and 5. Such parts can include various components and shielding structures mounted or implemented on the substrate panel 354. The upper-portion panel 356 can also include an overmold layer which can be formed as a common layer for a number of individual units. In the example of FIG. 11H, conductive features 378 are shown to be implemented within the substrate panel 354. Each conductive feature 378 can straddle the corresponding boundary 360, such than when separation occurs at the boundary 360, each of the two exposed side walls of the substrates includes an exposed portion of the conductive feature 378 that has been cut. Each of such cut conductive feature is electrically connected to a ground plane (not shown) within the corresponding substrate.

Figure 11I:
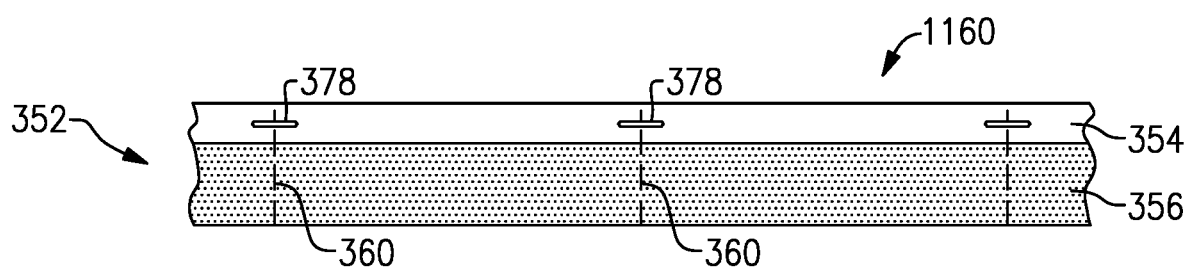

Referring to FIG. 11I, a fabrication state 1160 can include the panel 352 of FIG. 11A being inverted so that its underside faces upward. Such an inverted orientation can allow processing of the underside while the individual units are still attached in the panel.

Figure 11J:
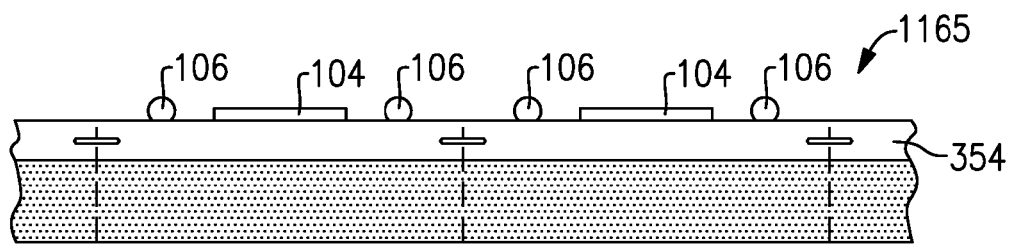

Referring to FIG. 11J, a fabrication state 1165 can include a lower component 104 being attached for each unit on the underside (which is facing upward) of the substrate 254. The fabrication state 1165 may also include an array of solder balls 106 being formed for each unit on the underside (which is facing upward) of the substrate 254. Such a step is shown to yield an array of dual-sided units to be singulated. It will be understood that the lower component 104 may be attached for each unit (on the underside) after the array of solder balls 106 is formed, or vice versa. It shall also be understood that the lower component (for each unit on the underside) and the array of solder balls 106 may be attached, implemented, and/or formed substantially simultaneously.

Figure 11K:
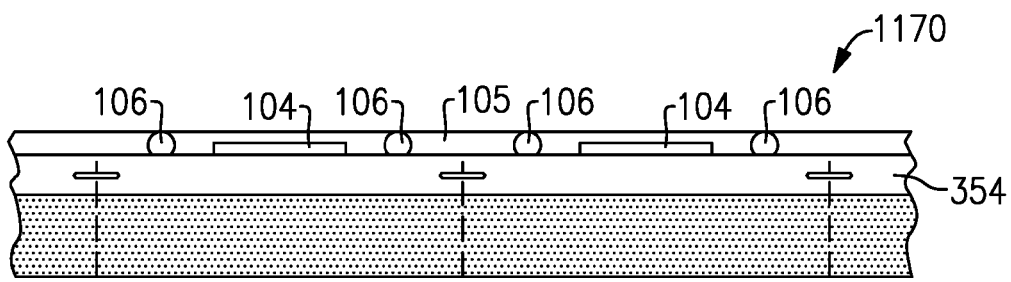

Referring to FIG. 11K, a fabrication state 1170 can include implementing an overmold 105 over the lower components 104 and the solder balls 106. In one embodiment, the overmold 105 may completely encapsulate the lower component 104 in the fabrication state 1120. In another embodiment, the overmold 105 may completely encapsulate the solder balls 106. For example, the height of the overmold 105 may be higher than the height of the solder balls 106. In a further embodiment, the height of the overmold 105 may be equal (or substantially equal) to the height of the solder balls.

Figure 11L:
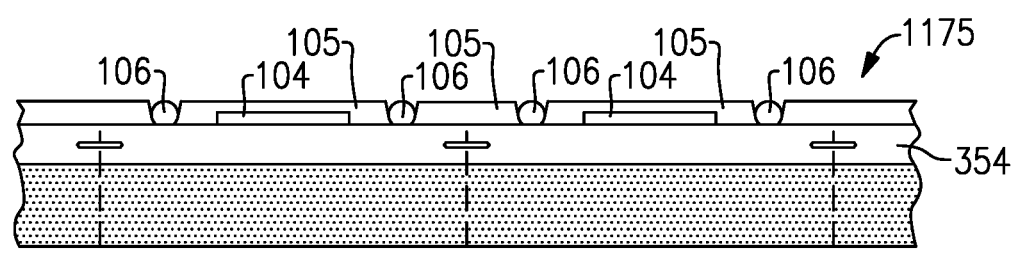

Referring to FIG. 11L, a fabrication state 1125 can include removing portions of the overmold 105 in areas that are around the solder balls 106 (e.g., around the through-mold connections). For example, portions of the overmold 105 in a circular area (centered around a solder ball 106) may be removed (e.g., a circular portion of the overmold 105 centered around a solder ball 106 may be removed). As illustrated in FIG. 11L, there may be a gap between the overmold 105 and the top of the solder balls 106. One having ordinary skill in the art understands that the portions of the overmold 105 that are removed may have various sizes and/or shapes. For example, a square shaped portion of the overmold centered around a solder ball 106 may be removed. In one embodiment, portions of the overmold 105 may be removed using a laser (e.g., a laser drill). For example, a laser may be used to burn and/or melt portions of the overmold 105 in the areas around the solder balls 106. One having ordinary skill in the art understands that various other methods, processes, and/or operations may be used to remove portions of the overmold 105. As illustrated in FIG. 11L, there may be a gap between the overmold 105 and the top of the solder balls 106. In other embodiments, the gap between the overmold 105 and the top of the solder balls 106 may be larger, smaller, or may not be present.

Figure 11M:
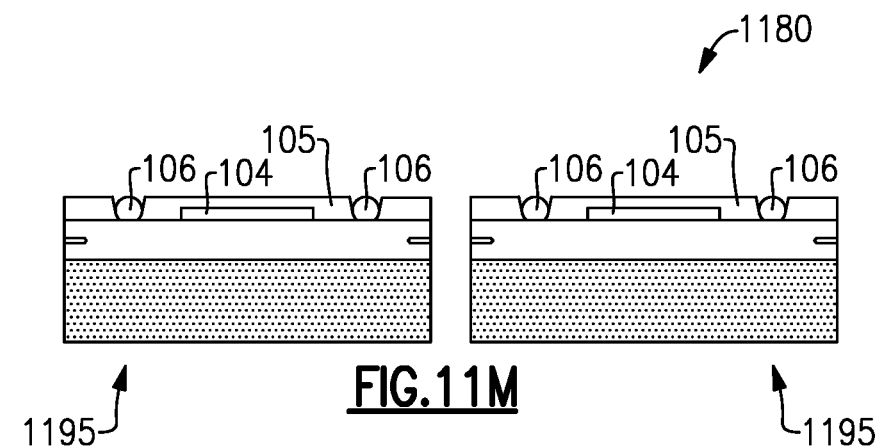

Referring to FIG. 11M, a fabrication state 1135 can include individual units being singulated to yield a plurality of un-shielded dual-sided packages 1195 substantially ready for conformal shielding process steps, or if shielding is not needed, substantially ready to be mounted to circuit boards. As described above, each of the dual-sided packages 1195 includes side walls; and each side wall is shown to include an exposed portion of the cut conductive feature 378. In some embodiments, such a singulation process can be achieved while the panel (352) is in its inverted orientation (as shown in the example of FIG. 11L), or while the panel (352) is in its upright orientation (e.g., as in the example of FIG. 11H). A close-up view of the solder balls 106 and additional details (of the solder balls 106) are illustrated/discussed above in conjunction with FIG. 2.

Figure 12A:
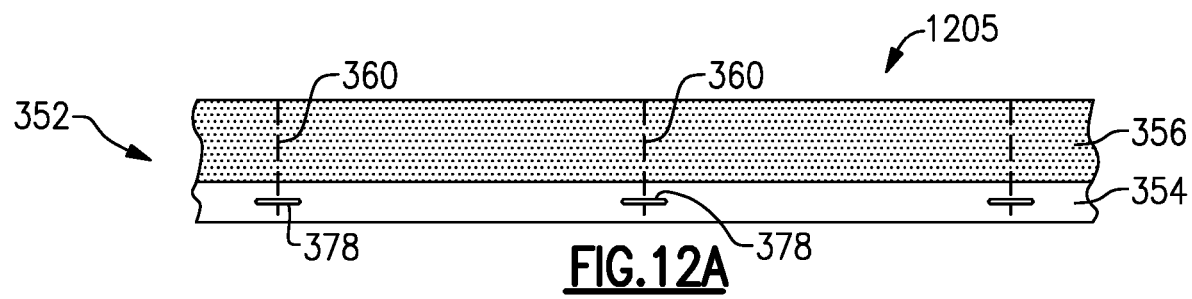
FIGS. 12A-12F illustrate various stages of fabrication processes for implementing dual-sided packages, according to some implementations.

FIGS. 12A-12F show various example states leading to formation of dual-sided packages without conformal shielding. Referring to FIG. 12A, a fabrication state 1205 can include a panel 352 having a plurality of to-be-singulated units. For example, singulation can occur at boundaries depicted by dashed lines 360 so at to yield singulated individual units. The panel 352 is shown to include a substrate panel 354 on which upper portions (collectively indicated as 356) are formed. Each unit of such an upper-portion panel can include various parts described herein in reference to any combination of FIGS. 4, 5, and 5. Such parts can include various components and shielding structures mounted or implemented on the substrate panel 354. The upper-portion panel 356 can also include an overmold layer which can be formed as a common layer for a number of individual units. In the example of FIG. 12A, conductive features 378 are shown to be implemented within the substrate panel 354. Each conductive feature 378 can straddle the corresponding boundary 360, such than when separation occurs at the boundary 360, each of the two exposed side walls of the substrates includes an exposed portion of the conductive feature 378 that has been cut. Each of such cut conductive feature is electrically connected to a ground plane (not shown) within the corresponding substrate.

Figure 12B:
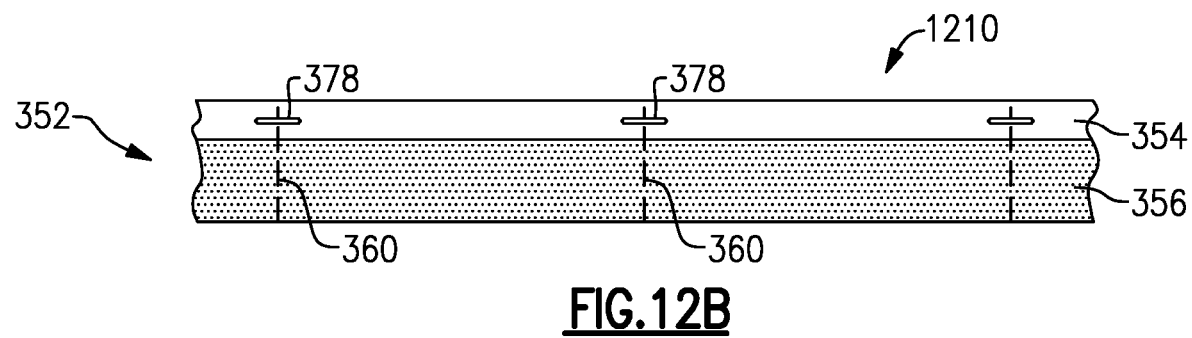

Referring to FIG. 12B, a fabrication state 1210 can include the panel 352 of FIG. 12A being inverted so that its underside faces upward. Such an inverted orientation can allow processing of the underside while the individual units are still attached in the panel.

Figure 12C:
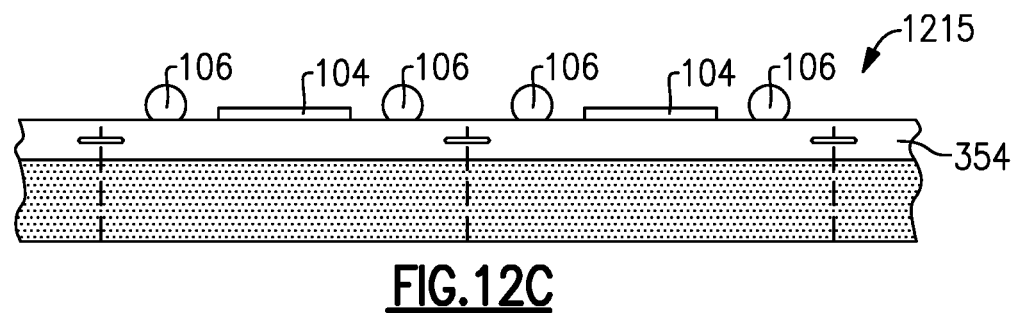

Referring to FIG. 12C, a fabrication state 1265 can include a lower component 104 being attached for each unit on the underside (which is facing upward) of the substrate 254. The fabrication state 1265 may also include an array of solder balls 106 being formed for each unit on the underside (which is facing upward) of the substrate 254. Such a step is shown to yield an array of dual-sided units to be singulated. It will be understood that the lower component 104 may be attached for each unit (on the underside) after the array of solder balls 106 is formed, or vice versa. It shall also be understood that the lower component (for each unit on the underside) and the array of solder balls 106 may be attached, implemented, and/or formed substantially simultaneously.

Figure 12D:
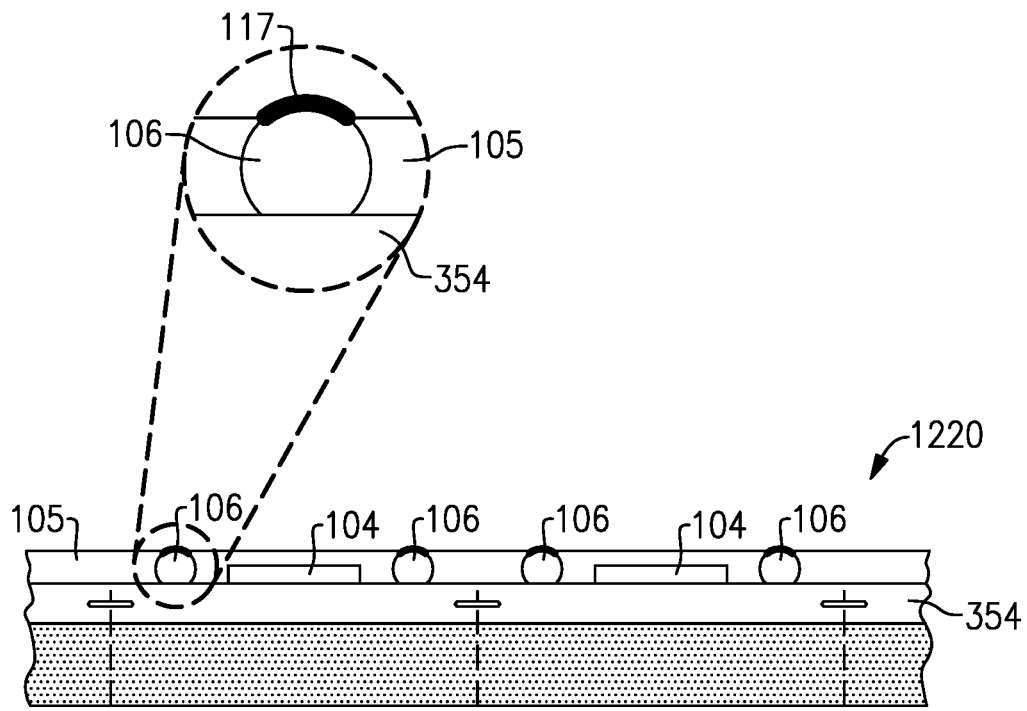

Referring to FIG. 12D, a fabrication state 1270 can include implementing an overmold 105 over the lower components 104 and the solder balls 106. In one embodiment, the overmold 105 may completely encapsulate the lower component 104 in the fabrication state 1220. The overmold 105 may also substantially encapsulate the solder balls 106. For example, as illustrated in the close-up view of solder ball 106, the height of the overmold 105 may be shorter than the height of the solder ball 106 but the majority of the solder ball 106 may be encapsulated by the overmold 105. In one embodiment, a layer 117 (e.g., a film, a coating, a thin sheet, etc.) of overmold material may be deposited on the tops of the solder balls 106 after the overmold 105 is implemented over the lower components 104 and the solder balls 106.

Figure 12E:
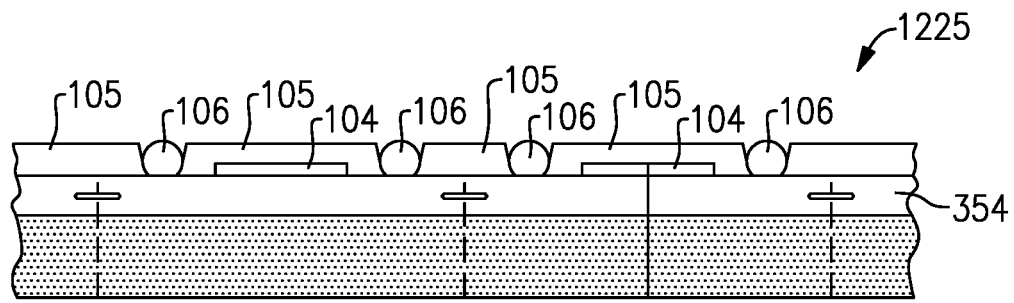

Referring to FIG. 12E, a fabrication state 1225 can include removing the layer 117 (e.g., the film of overmold material) from the tops of the solder balls 106. For example, a laser may be used to burn and/or melt the layer 117 from the top of a solder ball 106. One having ordinary skill in the art understands that various other methods, processes, and/or operations may be used to remove the layer 117. As illustrated in FIG. 12E, there may be a gap between the overmold 105 and the top of the solder balls 106 after removing the layer 117. In other embodiments, the gap between the overmold 105 and the top of the solder balls 106 may be larger, smaller, or may not be present.

Figure 12F:
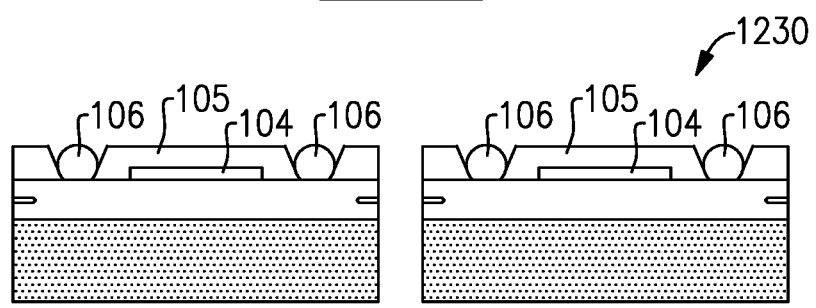

Referring to FIG. 12F, a fabrication state 1230 can include individual units being singulated to yield a plurality of un-shielded dual-sided packages 1290 substantially ready for conformal shielding process steps, or if shielding is not needed, substantially ready to be mounted to circuit boards. As described above, each of the dual-sided packages 1290 includes side walls; and each side wall is shown to include an exposed portion of the cut conductive feature 378. In some embodiments, such a singulation process can be achieved while the panel (352) is in its inverted orientation (as shown in the example of FIG. 12E), or while the panel (352) is in its upright orientation (e.g., as in the example of FIG. 12A). A close-up view of the solder balls 106 and additional details (of the solder balls 106) are illustrated/discussed above in conjunction with FIG. 2.

Figure 13A:
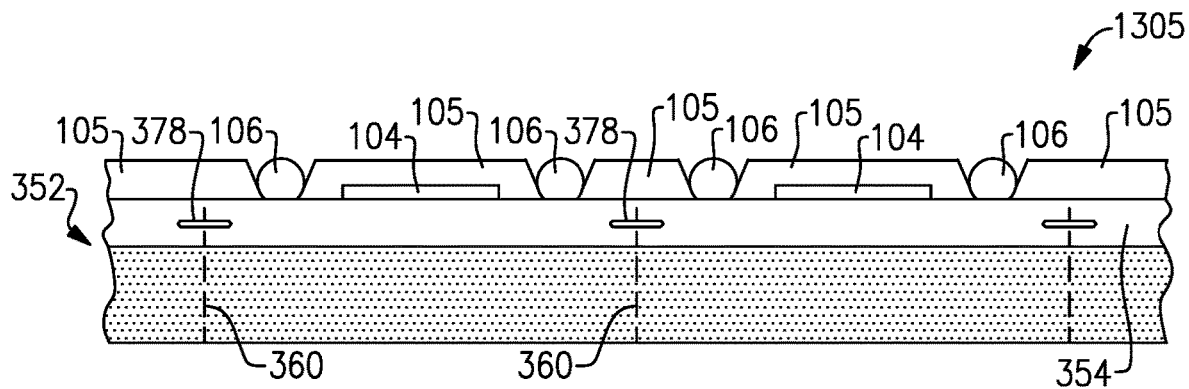
FIGS. 13A-13C illustrate various stages of forming dual-sided packages without conformal shielding, according to some implementations.
Figure 13B:
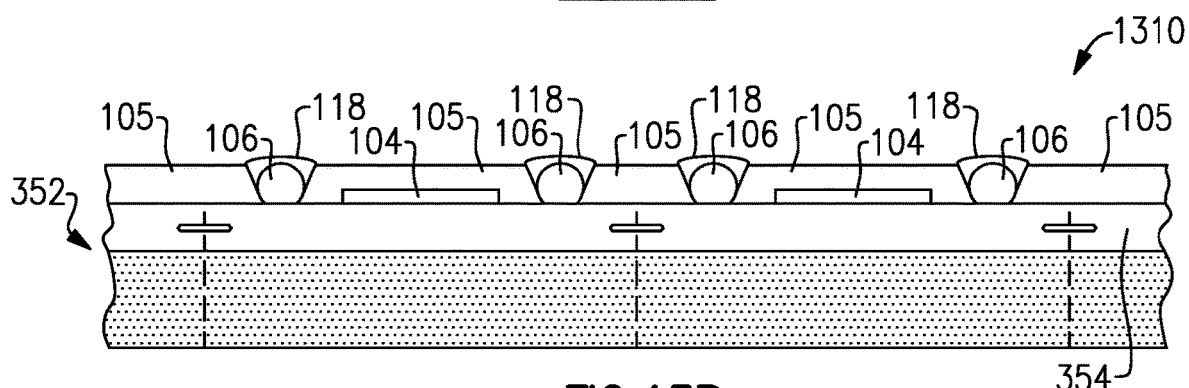
Figure 13C:
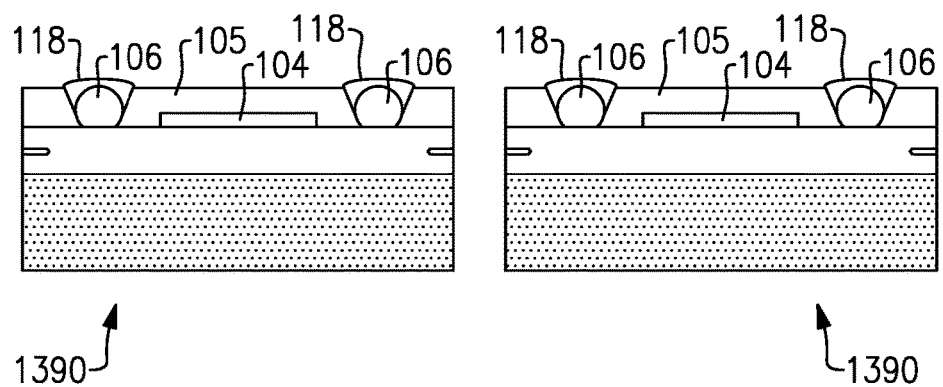

FIGS. 13A-13C show various example states leading to formation of dual-sided packages without conformal shielding. Referring to FIG. 13A, a fabrication state 1305 may include a panel 352 with solder balls 106, components 104, and an overmold 105 implemented on a substrate panel 354, as discussed above. Upper portions (collectively indicated as 356) may be formed on the substrate panel 354, as discussed above. For example, the panel 352 may result from the fabrication state 1130 illustrated in FIG. 11F, the fabrication state 1175 illustrated in FIG. 11L, and/or the fabrication state 12E illustrated in FIG. 12E. In the example of FIG. 13A, conductive features 378 are shown to be implemented within the substrate panel 354. Each conductive feature 378 can straddle the corresponding boundary 360, such than when separation occurs at the boundary 360, each of the two exposed side walls of the substrates includes an exposed portion of the conductive feature 378 that has been cut. Each of such cut conductive feature is electrically connected to a ground plane (not shown) within the corresponding substrate.

Referring to FIG. 13B, a fabrication state 1310 may include forming, depositing, implementing, etc., conductive material 118 on top of the solder balls 106. For example additional solder balls may be formed on top of the solder balls 106. In another example, solder material may be screen printed on top of the solder balls 106. The additional conductive material may be used to attach the dual-sided packages to a surface (e.g., to a circuit board). The additional conductive material may also provide electrical connections and/or thermal conductivity between components/circuits of the dual-sided packages and/or other components/circuits (e.g., between components/circuits located on a circuit board).

Referring to FIG. 13C, a fabrication state 1315 can include individual units being singulated to yield a plurality of un-shielded dual-sided packages 1390 substantially ready for conformal shielding process steps, or if shielding is not needed, substantially ready to be mounted to circuit boards. As described above, each of the dual-sided packages 1390 includes side walls; and each side wall is shown to include an exposed portion of the cut conductive feature 378. In some embodiments, such a singulation process can be achieved while the panel (352) is in its inverted orientation (as shown in the example of FIG. 13A), or while the panel (352) is in its upright orientation. A close-up view of the solder balls 106 and additional details (of the solder balls 106) are illustrated/discussed above in conjunction with FIG. 2.

Examples Related to Conformal Coating

Figure 14A:
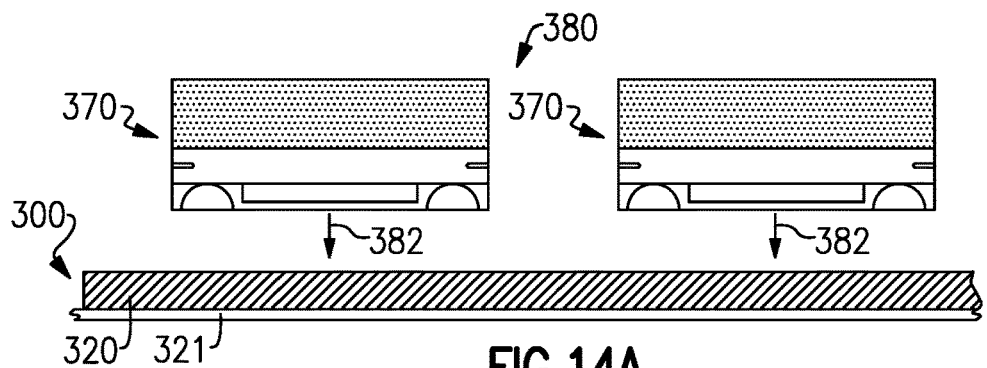
FIGS. 14A-14D illustrate various stages of processing individual packages with a frame carrier, according to some implementations.

FIGS. 14A-14D show various states of a process that can be implemented to process individual units such as the un-shielded dual-sided packages 370 of FIG. 10D with a frame carrier 300. Referring to FIG. 14A, a fabrication state 380 can include a plurality of un-shielded dual-sided packages 370 being positioned (arrow 382) over an adhesive layer 320. Examples of the adhesive layer 320 may include a layer of glue, a layer of paste, a layer of epoxy/epoxy resin, etc. The adhesive layer 320 may be deposited over a surface 321 of the frame carrier 300 (e.g., an upper surface of the frame carrier 300). A close-up view of the solder balls 106 and additional details (of the solder balls 106) are illustrated/discussed above in conjunction with FIG. 2.

Figure 14B:
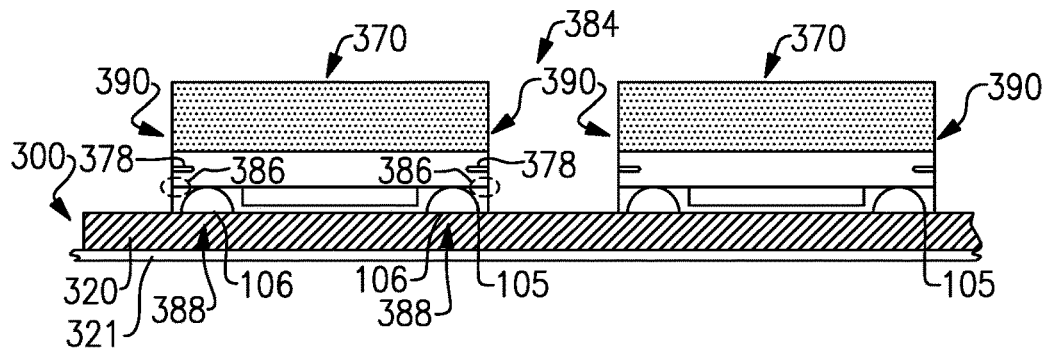

Referring to FIG. 14B, a fabrication state 383 can include the un-shielded dual-sided packages 370 positioned such that the solder balls 106 and/or a surface of the overmold on the underside of the packaging substrate (e.g., overmold 105 illustrated in FIG. 2) engage (e.g., are in contact with) the surface 321. As illustrated in FIG. 14B, the solder balls 106 may engage the surface of the adhesive layer 320. Such an engagement between the lower surface of the dual-sided packages 370 and the surface 321 is indicated as 388. Also as illustrated in FIG. 14B, the overmold 105 on the underside of the packaging substrate may engage adhesive layer 320 (e.g., may contact the adhesive layer 320). Such an engagement between the overmold 105 on the underside of the packaging substrate and the adhesive layer 320 is indicated as 386.

Once the individual un-shielded dual-sided packages 370 are arranged in such a manner, some or all of the subsequent steps can be performed in manners as if the units are in a panel format. Advantageously, such steps can include formation of a conformal shielding layer on the upper surface and the side walls (390) of each un-shielded dual-sided package 370. More particularly, and as described herein, the position of the un-shielded dual-sided package 370 relative to the plate 304 allows the side walls 390 to be exposed substantially fully for metal deposition by techniques such as sputter deposition. As further shown in FIG. 14B, the un-shielded dual-sided packages 370 can be arranged so that the un-shielded dual-sided packages 370 positioned therein are spaced apart sufficiently to facilitate effective sputter deposition of metal on the side walls 390.

Figure 14C:
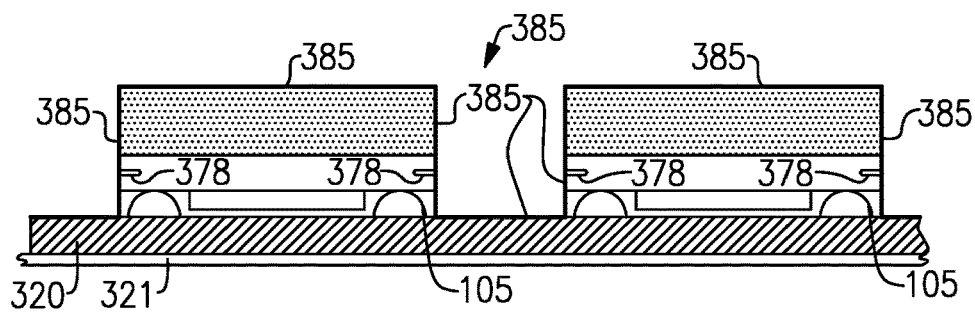

FIG. 14C shows a fabrication state 384 where a conformal conductive layer 385 has been formed. Such a conformal conductive layer 385 is shown to cover the upper surface and the side walls (390) of each dual-sided package. The side wall portion of the conformal conductive layer 385 is further shown to be in electrical contact with the conductive features 378 (which are in turn connected to a ground plane (not shown)) to thereby form an RF shield for the dual-sided package.

Figure 14D:
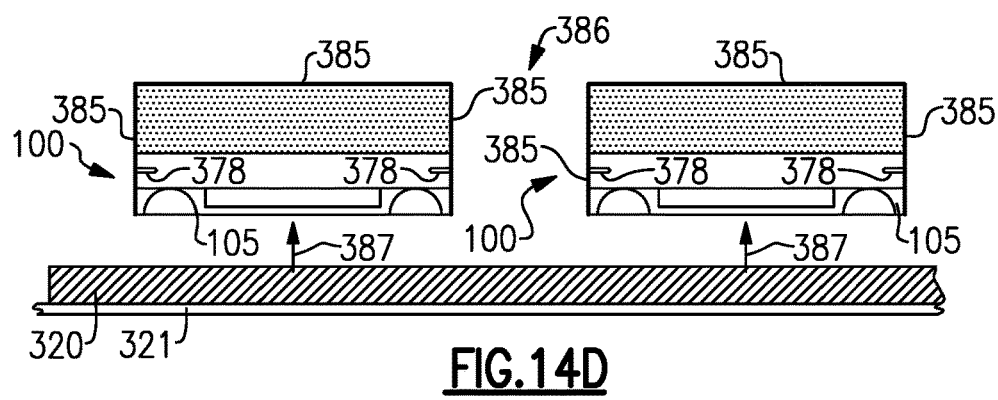

FIG. 14D shows a fabrication state 386 where shielded dual-sided packages 100 are being removed (arrow 387) from the frame carrier 300. Thus, one can see that the resulting dual-sided packages 100 with conformal shielding can be obtained by different processes. For example, the dual-sided packages 100 with conformal shielding as described in reference to FIG. 14D are similar to the dual-sided packages 100 (with conformal shielding) of FIG. 14D. Accordingly, it will be understood that other variations in process steps can be implemented.

In one embodiment, portions of the adhesive layer 320 may remain attached (e.g., may stick) to the shielded dual-sided packages 100 when the shielded dual-sided packages 100 are removed (not shown in the figures). The portions of the adhesive layer 320 that remain attached to the shielded dual-sided packages 100 may be removed in a later process. For example, the portions of the adhesive layer 320 that remain attached to the shielded dual-sided packages 100 may be removed during a cleaning process.

Examples of Products Related to Dual-Sided Packages

Figure 15:
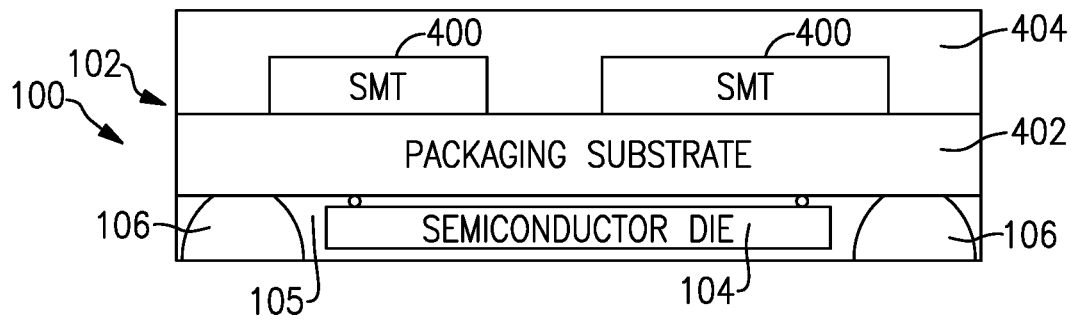
FIG. 15 illustrates a dual-sided package having one or more surface-mount technology devices mounted on a packaging substrate, according to some implementations.

As described herein, a shielded package and a lower component of a dual-sided package can include different combinations of components. FIG. 15 shows that in some embodiments, a dual-sided package 100 can include a shielded package 102 having one or more surface-mount technology (SMT) devices 400 mounted on a packaging substrate 402. As further shown in FIG. 15, one or more semiconductor die 104 can be mounted under the packaging substrate 402. As described herein, such one or more die can be mounted within a region generally defined by an array of solder balls 106.

As further described herein, an overmold 404 can be formed over the packaging substrate 402 so as to substantially encapsulate the SMT device(s) 404, and to facilitate shielding functionalities. It will be understood that the shielded package 102 can include one or more shielding features as described herein. An overmold 105 may be formed and/or implemented in the underside volume (where the semiconductor die 104 is located) formed by the solder balls 106 (e.g., formed by a set of through-mold connections, such as a BGA). In one embodiment, the overmold 105 may encapsulate at least a portion of the semiconductor die 104. For example, the overmold 105 may fully or partially encapsulate the semiconductor die 104. In another embodiment, the overmold 105 may encapsulate at least a portion of the solder balls 106 (e.g., through-mold connections). For example, the overmold 105 may fully or partially encapsulate the solder balls 106. As discussed above, the overmold 105 and/or the solder balls 106 (e.g., the exposed portions of the solder balls 106) may form a land grid array (LGA) type/style package. A close-up view of the solder balls 106 and additional details (of the solder balls 106) are illustrated/discussed above in conjunction with FIG. 2.

Figure 16:
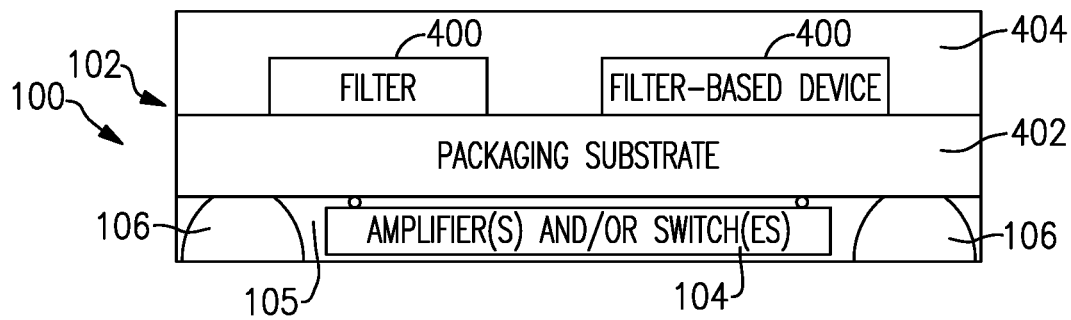
FIG. 16 illustrates another dual-sided package having one or more surface-mount technology devices mounted on a packaging substrate, according to some implementations.

FIG. 16 shows a dual-sided package 100 that can be a more specific example of the dual-sided package of FIG. 15. In the example of FIG. 16, the SMT device(s) can be one or more filters and/or filter-based devices 400 that are encapsulated by an overmold 404. Further, the semiconductor die 104 mounted under a packaging substrate 402 can be a die having RF amplifier(s) and/or switch(es). Accordingly, such a dual-side package can be implemented as different modules configured to facilitate transmission and/or reception of RF signals. For example, the dual-sided package 100 can be implemented as a power amplifier (PA) module, a low-noise amplifier (LNA) module, a front-end module (FEM), a switching module, etc. An overmold 105 may be formed and/or implemented in the underside volume (where the semiconductor die 104 is located) formed by the solder balls 106 (e.g., formed by a set of through-mold connections, such as a BGA). In one embodiment, the overmold 105 may encapsulate at least a portion of the semiconductor die 104. For example, the overmold 105 may fully or partially encapsulate the semiconductor die 104. In another embodiment, the overmold 105 may encapsulate at least a portion of the solder balls 106 (e.g., through-mold connections). For example, the overmold 105 may fully or partially encapsulate the solder balls 106. As discussed above, the overmold 105 and/or the solder balls 106 (e.g., the exposed portions of the solder balls 106) may form a land grid array (LGA) type/style package. A close-up view of the solder balls 106 and additional details (of the solder balls 106) are illustrated/discussed above in conjunction with FIG. 2.

Figure 17:
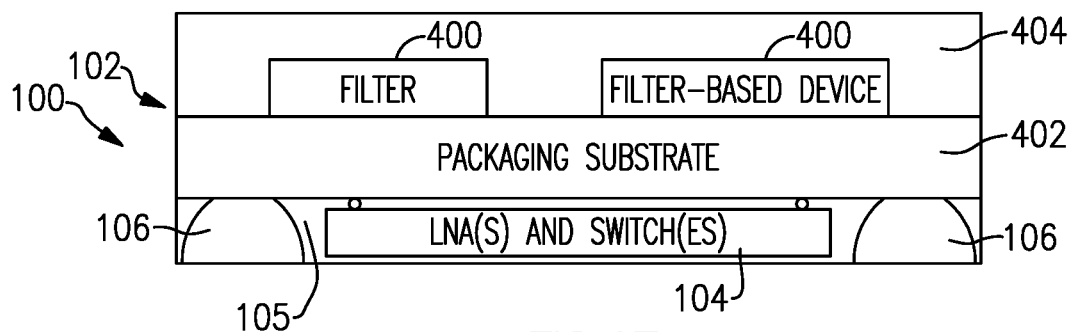
FIG. 17 illustrates another dual-sided package having one or more surface-mount technology devices mounted on a packaging substrate, according to some implementations.

FIG. 17 shows a dual-sided package 100 that can be a more specific example of the dual-sided package of FIG. 16. In the example of FIG. 17, the semiconductor die 104 mounted under a packaging substrate 402 can be a die having one or more LNAs and one or more switches. In some embodiments, such a dual-side package can be implemented as a module having LNA-related functionalities, including, for example, an LNA module. An overmold 105 may be formed and/or implemented in the underside volume (where the semiconductor die 104 is located) formed by the solder balls 106 (e.g., formed by a set of through-mold connections, such as a BGA). In one embodiment, the overmold 105 may encapsulate at least a portion of the semiconductor die 104. For example, the overmold 105 may fully or partially encapsulate the semiconductor die 104. In another embodiment, the overmold 105 may encapsulate at least a portion of the solder balls 106 (e.g., through-mold connections). For example, the overmold 105 may fully or partially encapsulate the solder balls 106. As discussed above, the overmold 105 and/or the solder balls 106 (e.g., the exposed portions of the solder balls 106) may form a land grid array (LGA) type/style package. A close-up view of the solder balls 106 and additional details (of the solder balls 106) are illustrated/discussed above in conjunction with FIG. 2.

Figure 18A:
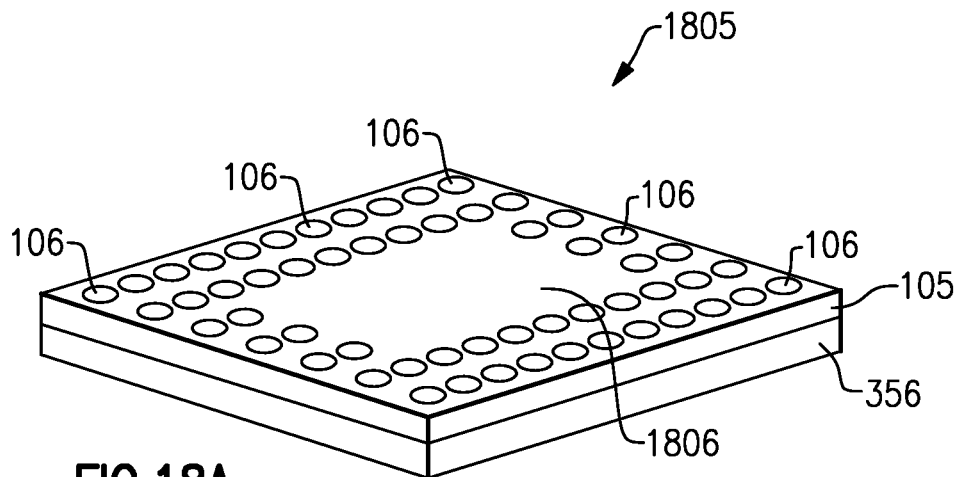
FIG. 18A illustrates a top-down perspective view of an underside of a dual-sided package, according to some implementations.

FIG. 18A illustrates a top-down perspective view of an underside of a dual-sided package 1805, according to some embodiments. In one embodiment, the dual-sided package 1805 may result from the fabrication/manufacturing process illustrated in FIGS. 9A-9L and 10A-10L. The dual sided package includes a substrate on which an upper portion (collectively indicated as 356) are formed, as discussed above. The solder balls 106 and the overmold 105 may be implemented on a surface of the upper portion 356, as discussed above. The solder balls 106 may be arranged around a region 1806. A component (e.g., component 104 discussed above) may be located under the overmold 105 in the region 1806. The solder balls 106 may be arranged such that the solder balls 106 form a rectangular perimeter around the region 1806. For example, a first group of solder balls may form a rectangular perimeter around the region 1806 (e.g., the inner rectangular perimeter of solder balls 106). A second group of solder balls 106 may form a rectangular perimeter around the first group of solder balls 106 (e.g., the outer rectangular perimeter of solder balls 106).

As illustrated in FIG. 18A, the solder balls 106 are exposed through the overmold 105. For example, portions of the solder balls 106 may be removed when portions of the overmold 105 are removed during a fabrication/manufacturing process/state, as discussed above. The top of the remaining portions of the solder balls 106 may be visible after the portions of the overmold 105 are removed.

Figure 18B:
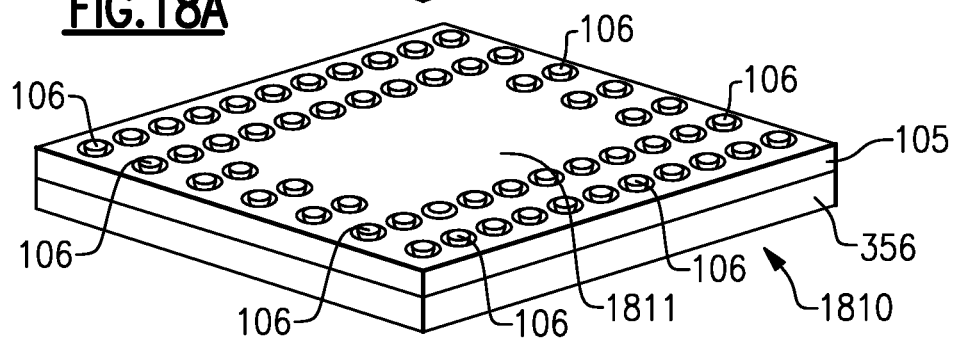
FIG. 18B illustrates a top-down perspective view of an underside of a dual-sided package, according to some implementations.

FIG. 18B illustrates a top-down perspective view of an underside of a dual-sided package 1810, according to some embodiments. In one embodiment, the dual-sided package 1810 may result from the fabrication/manufacturing process illustrated in FIGS. 11A-11M and 12A-12F. The dual sided package includes a substrate on which an upper portion (collectively indicated as 356) are formed, as discussed above. The solder balls 106 and the overmold 105 may be implemented on a surface of the upper portion 356, as discussed above. The solder balls 106 may be arranged around a region 1811. A component (e.g., component 104 discussed above) may be located under the overmold 105 in the region 1811. The solder balls 106 may be arranged such that the solder balls 106 form a rectangular perimeter around the region 1811. For example, a first group of solder balls may form a rectangular perimeter around the region 1811 (e.g., the inner rectangular perimeter of solder balls 106). A second group of solder balls 106 may form a rectangular perimeter around the first group of solder balls 106 (e.g., the outer rectangular perimeter of solder balls 106).

As illustrated in FIG. 18A, the solder balls 106 are exposed through the overmold 105. Also as illustrated, portions of the overmold 105 in regions around each solder ball 106 (e.g., in a circular region around each solder ball 106) have been removed, as discussed above. Removing the portions of the overmold 105 in the regions around each solder ball 106 may create a gap (e.g., a torus/donut shaped gap between each solder ball 106 and the overmold 105, as discussed above.

Figure 18C:
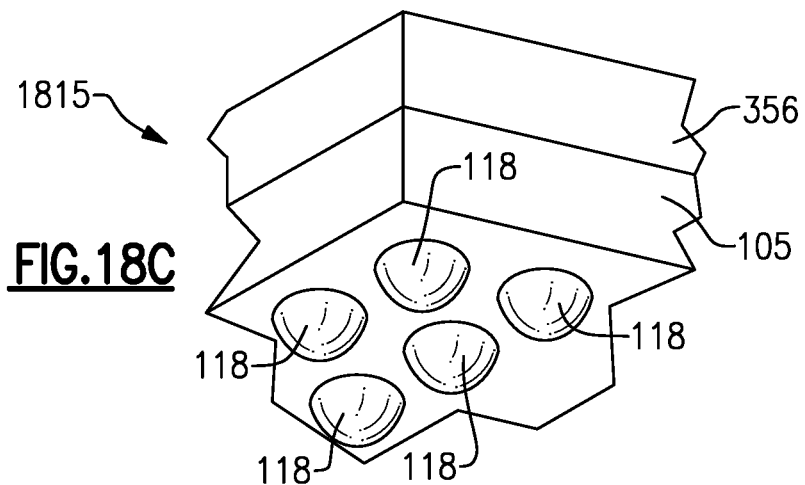
FIG. 18C illustrates a bottom-up close-up perspective view of a portion of an underside of a dual-sided package, according to some implementations.

FIG. 18C illustrates a bottom-up close-up perspective view of a portion of an underside of a dual-sided package 1815, according to some embodiments. In one embodiment, the dual-sided package 1810 may result from the fabrication/manufacturing process illustrated in FIGS. 13A-13C. The dual sided package includes a substrate on which an upper portion (collectively indicated as 356) are formed, as discussed above. The solder balls and the overmold 105 may be implemented on a surface of the upper portion 356, as discussed above. Additional conductive material 118 may be formed, implemented, deposited, etc., on top of the solder balls, as discussed above in conjunction with FIGS. 13A-13C. The additional conductive material 118 may result in a dome shape that protrudes above the surface of the overmold 105. For example, the height of the conductive material 118 may be greater than the height of the overmold 105.

Although the examples, embodiments, implementations, and/or configurations described herein may illustrate a component (e.g., component 104 illustrated in FIG. 1) positioned in a middle of a surface of a module and may illustrate through-mold connections (e.g., contact features, solder balls, pillars, etc.) positioned around the component, one having ordinary skill in the art understands that the positions, sizes, positioning/placements, and/or number of the through-mold connections and/or components may vary. For example, a component may not be located in the middle of a surface of a module and may be located along an outer edge (e.g., a left edge) of the surface of the module. In another example, through-mold connections (e.g., solder balls, pillars, contact features, etc.) may be located in the middle of the surface of a module (e.g., may be located where component 104 is located in FIG. 6B).

Figure 19:
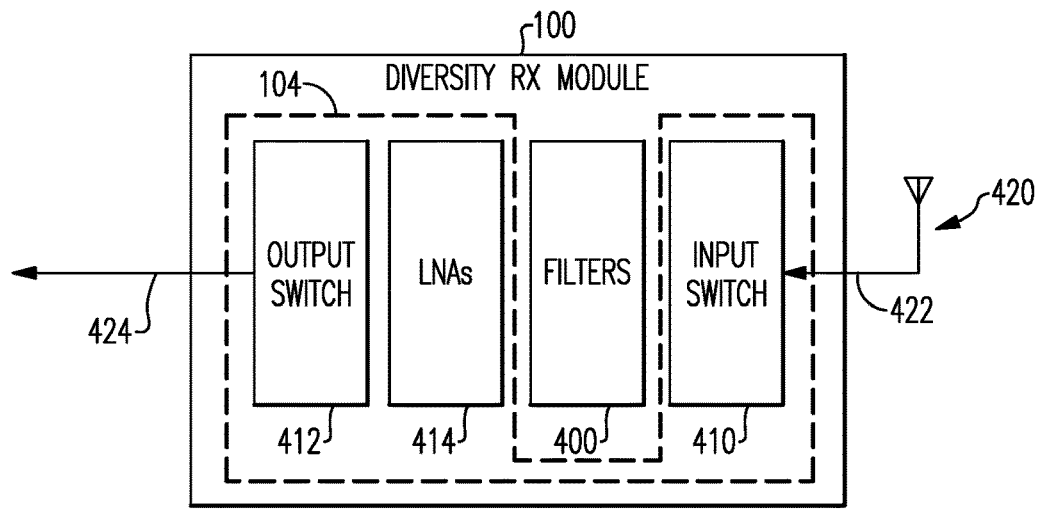
FIG. 19 illustrates a dual-sided package implemented as a diversity receive module, according to some implementations.
Figure 20:
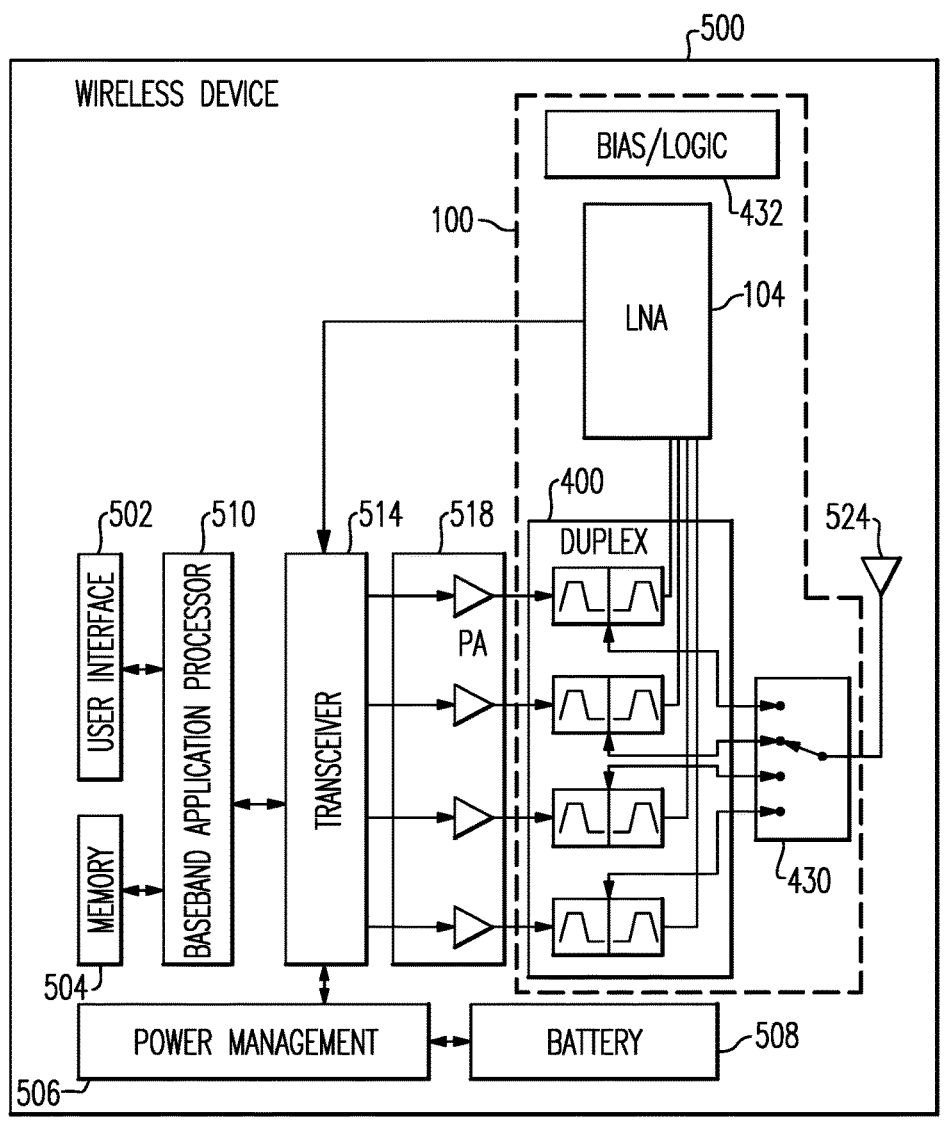
FIG. 20 illustrates a dual-sided package implemented in a wireless device, according to some implementations.

FIGS. 19 and 20 show examples of how the dual-sided package 100 illustrated in the figures can be implemented in wireless devices. FIG. 19 shows that in some embodiments, a dual-sided package having one or more features as described herein can be implemented as a diversity receive (RX) module 100. Such a module can be implemented relatively close to a diversity antenna 420 so as to minimize or reduce losses and/or noise in a signal path 422.

The diversity RX module 100 can be configured such that switches 410 and 412, as well as LNAs 414, are implemented in a semiconductor die (depicted as 104) that is mounted underneath a packaging substrate. Filters 400 can be mounted on such a packaging substrate as described herein.

As further shown in FIG. 19, RX signals processed by the diversity RX module 100 can be routed to a transceiver through a signal path 424. In wireless applications where the signal path 424 is relatively long and lossy, the foregoing implementation of the diversity RX module 100 close to the antenna 420 can provide a number of desirable features.

FIG. 20 shows that in some embodiment a dual-sided package having one or more features as described herein can be implemented in other types of LNA applications. For example, in an example wireless device 500 of FIG. 20, an LNA or LNA-related module 100 can be implemented as a dual-sided package as described herein, and such a module can be utilized with a main antenna 524.

The example LNA module 100 of FIG. 20 can include, for example, one or more LNAs 104, a bias/logic circuit 432, and a band-selection switch 430. Some or all of such circuits can be implemented in a semiconductor die that is mounted under a packaging substrate of the LNA module 100. In such an LNA module, some or all of duplexers 400 can be mounted on the packaging substrate so as to form a dual-sided package having one or more features as described herein.

FIG. 20 further depicts various features associated with the example wireless device 500. Although not specifically shown in FIG. 20, a diversity RX module 100 of FIG. 19 can be included in the wireless device 500 with the LNA module 100, in place of the LNA module 100, or any combination thereof. It will also be understood that a dual-sided package having one or more features as described herein can be implemented in the wireless device 500 as a non-LNA module.

In the example wireless device 500, a power amplifier (PA) circuit 518 having a plurality of PAs can provide an amplified RF signal to a switch 430 (via duplexers 400), and the switch 430 can route the amplified RF signal to an antenna 524. The PA circuit 518 can receive an unamplified RF signal from a transceiver 514 that can be configured and operated in known manners.

The transceiver 514 can also be configured to process received signals. Such received signals can be routed to the LNA 104 from the antenna 524, through the duplexers 400. Various operations of the LNA 104 can be facilitated by the bias/logic circuit 432.

The transceiver 514 is shown to interact with a baseband sub-system 510 that is configured to provide conversion between data and/or voice signals suitable for a user and RF signals suitable for the transceiver 514. The transceiver 514 is also shown to be connected to a power management component 506 that is configured to manage power for the operation of the wireless device 500. Such a power management component can also control operations of the baseband sub-system 510.

The baseband sub-system 510 is shown to be connected to a user interface 502 to facilitate various input and output of voice and/or data provided to and received from the user. The baseband sub-system 510 can also be connected to a memory 504 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged radio-frequency device comprising:
a packaging substrate configured to receive one or more components, the packaging substrate including a first side and a second side;
a package implemented on the first side of the packaging substrate, the package including a first overmold structure;
a component mounted to the second side of the packaging substrate;
a second overmold structure implemented on the second side, the second overmold structure substantially encapsulating at least a portion of the component and including an underside surface; and
a set of through-mold connections implemented on the second side of the packaging substrate, the set of through-mold connections defining a mounting area on the second side of the packaging substrate, each through-mold connection having an exposed surface substantially coplanar with the underside surface of the second overmold structure, each through-mold connection having the largest lateral dimension at or near the exposed surface substantially coplanar with the underside surface of the second overmold structure, each through-mold connection including a circular curvature and having a truncated circular shape that is a semicircular shape, and the exposed surface corresponding to the largest diameter of a corresponding circle.

2. The packaged radio-frequency device of claim 1 wherein at least some of the set of through-mold connections include a solder ball.

3. The packaged radio-frequency device of claim 1 wherein the set of through-mold connections includes a ball grid array configured to allow the packaged radio-frequency device to be mounted on a circuit board.

4. The packaged radio-frequency device of claim 3 wherein the ball grid array includes a first group of solder balls arranged to partially or fully surround the component mounted to the second side of the packaging substrate.

5. The packaged radio-frequency device of claim 4 wherein the ball grid array further includes a second group of solder balls arranged to partially or fully surround the first group of solder balls.

6. The packaged radio-frequency device of claim 5 wherein at least some of the first group of solder balls are electrically connected to input and output nodes of a first circuit included in the package.

7. The packaged radio-frequency device of claim 6 wherein each of the second group of solder balls is electrically connected to a ground plane within the packaging substrate.

8. The packaged radio-frequency device of claim 7 wherein the first group of solder balls forms a rectangular perimeter around the component mounted to the second side of the packaging substrate.

9. The packaged radio-frequency device of claim 8 wherein the second group of solder balls forms a rectangular perimeter around the first group of solder balls.

10. A wireless device comprising:
a circuit board configured to receive a plurality of packaged modules; and
a radio-frequency module mounted on the circuit board, the radio-frequency module including a packaging substrate configured to receive one or more components, the packaging substrate including a first side and a second side, the radio-frequency module further including a package implemented on the first side of the packaging substrate, the package including a first overmold structure, the radio-frequency module further including a component mounted to the second side of the packaging substrate, the radio-frequency module further including a second overmold structure implemented on the second side, the second overmold structure substantially encapsulating at least a portion of the component and including an underside surface, the radio-frequency module further including a set of through-mold connections implemented on the second side of the packaging substrate, the set of through-mold connections defining a mounting area on the second side of the packaging substrate, each through-mold connection having an exposed surface substantially coplanar with the underside surface of the second overmold structure, each through-mold connection having the largest lateral dimension at or near the exposed surface substantially coplanar with the underside surface of the second overmold structure, each through-mold connection including a circular curvature and having a truncated circular shape that is a semicircular shape, and the exposed surface corresponding to the largest diameter of a corresponding circle.

11. The wireless device of claim 10 wherein at least some of the set of through-mold connections include a solder ball.

12. The wireless device of claim 10 wherein the set of through-mold connections includes a ball grid array configured to allow the radio-frequency module to be mounted on the circuit board.

13. The wireless device of claim 12 wherein the ball grid array includes a first group of solder balls arranged to partially or fully surround the component mounted to the second side of the packaging substrate.

14. The wireless device of claim 13 wherein the ball grid array further includes a second group of solder balls arranged to partially or fully surround the first group of solder balls.

15. The wireless device of claim 14 wherein at least some of the first group of solder balls are electrically connected to input and output nodes of a first circuit included in the package.

16. The wireless device of claim 15 wherein each of the second group of solder balls is electrically connected to a ground plane within the packaging substrate.

17. The wireless device of claim 16 wherein the first group of solder balls forms a rectangular perimeter around the component mounted to the second side of the packaging substrate.

18. The wireless device of claim 17 wherein the second group of solder balls forms a rectangular perimeter around the first group of solder balls.

* * * * *